US010326564B2

(12) United States Patent
Ge et al.

(10) Patent No.: US 10,326,564 B2
(45) Date of Patent: Jun. 18, 2019

(54) METHOD OF REDUCED STATE DECODING AND DECODER THEREOF

(71) Applicants: Yiqun Ge, Ottawa (CA); Wuxian Shi, Ottawa (CA)

(72) Inventors: Yiqun Ge, Ottawa (CA); Wuxian Shi, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 246 days.

(21) Appl. No.: 15/203,498

(22) Filed: Jul. 6, 2016

(65) Prior Publication Data

US 2017/0019222 A1    Jan. 19, 2017

Related U.S. Application Data

(60) Provisional application No. 62/192,013, filed on Jul. 13, 2015, provisional application No. 62/192,020, filed on Jul. 13, 2015, provisional application No. 62/191,701, filed on Jul. 13, 2015, provisional application No. 62/191,693, filed on Jul. 13, 2015, provisional application No. 62/192,927, filed on Jul. 15, 2015.

(51) Int. Cl.
*H04B 7/0456* (2017.01)
*H04L 5/00* (2006.01)
*H04B 7/26* (2006.01)

(52) U.S. Cl.
CPC ......... *H04L 5/0007* (2013.01); *H04B 7/2628* (2013.01)

(58) Field of Classification Search
None
See application file for complete search history.

(56) References Cited

U.S. PATENT DOCUMENTS

| 7,751,494 B2 * | 7/2010 | Borkar | H04B 7/0417 375/267 |
| 2005/0141644 A1 * | 6/2005 | Sadowsky | H04L 25/03216 375/324 |
| 2008/0304463 A1 * | 12/2008 | Borkar | H04B 7/0417 370/342 |

(Continued)

FOREIGN PATENT DOCUMENTS

| CN | 102857437 | 1/2013 |
| CN | 104168097 | 11/2014 |

(Continued)

OTHER PUBLICATIONS

International Search Report; PCT/CN2016/089791; dated Sep. 27, 2016.

*Primary Examiner* — Gregory B Sefcheck
*Assistant Examiner* — Jenkey Van

(57) ABSTRACT

Methods and devices are disclosed for receiving and decoding sparsely encoded data sequences using a message passing algorithm (MPA) or maximum likelihood sequence estimation (MLSE). Such data sequences may be used in wireless communications systems supporting multiple access, such as sparse code multiple access (SCMA) systems. The Methods and devices reduce the number of states in a search space for each received signal and associated function node based on a search threshold based on a characteristic related to the received signal and/or to a quality of a resource element over which the received signal is transmitted.

13 Claims, 14 Drawing Sheets

(56) References Cited

U.S. PATENT DOCUMENTS

| | | | |
|---|---|---|---|
| 2014/0140360 A1* | 5/2014 | Nikopour | H04J 13/00 370/479 |
| 2014/0169408 A1* | 6/2014 | Bayesteh | H04B 7/0473 375/144 |
| 2014/0201602 A1 | 7/2014 | Eroz et al. | |
| 2014/0334564 A1* | 11/2014 | Singh | H04B 7/0413 375/267 |
| 2014/0369434 A1 | 12/2014 | Taherzadehboroujeni et al. | |
| 2016/0127018 A1* | 5/2016 | Nammi | H04B 7/0417 375/267 |

FOREIGN PATENT DOCUMENTS

| | | |
|---|---|---|
| WO | WO2014075637 | 5/2014 |
| WO | 2015085574 | 6/2015 |

* cited by examiner

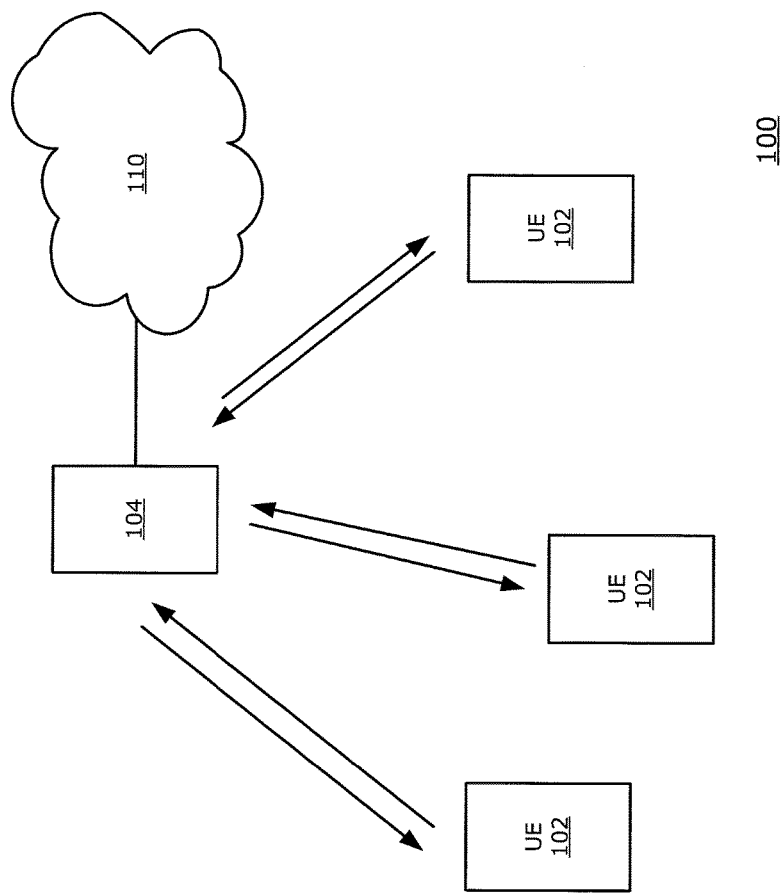

METHOD OF REDUCED STATE DECODING AND DECODER THEREOF

CROSS REFERENCES TO RELATED APPLICATIONS

This application claims priority based on U.S. provisional patent application No. 62/191,693, entitled "REDUCED-STATE DECODER FOR SCMA RECEIVER USING SUCCESSIVE-INTERFERENCE-CANCELLATION" filed Jul. 13, 2015, U.S. provisional patent application No. 62/191,701, entitled "REDUCED-STATE MLSE DECODER FOR SCMA RECEIVER" filed Jul. 13, 2015, U.S. provisional patent application No. 62/192,013, entitled "REDUCED STATE MESSAGE PASSING ALGORITHM DECODER AND RECEIVER" filed Jul. 13, 2015, U.S. provisional patent application No. 62/192,020, entitled "REDUCED STATE MESSAGE PASSING ALGORITHM DECODER AND RECEIVER" filed Jul. 13, 2015, and U.S. provisional patent application No. 62/192,927, entitled "REDUCED STATE MESSAGE PASSING ALGORITHM DECODER AND RECEIVER" filed Jul. 15, 2015, which are herein incorporated by reference.

TECHNICAL FIELD

The present application relates to mobile air interface technology, in particular to methods and systems for decoding sparsely encoded data in a received signal.

BACKGROUND

Sparsely encoded wireless data may be decoded using techniques such as message passing algorithm (MPA) or maximum likelihood sequence estimation (MLSE). Sparse code multiple access (SCMA) is one type of sparsely encoded data system proposed for multiple access in the next generation of mobile communication technology (often referred to as "5G"). Broadly speaking, SCMA is a coding technique that may enable non-orthogonal multiplexing of code layers, resource overloading, sparsity to reduce receiver complexity, multi-dimensional codewords, and spreading over multiple subcarriers. Non-orthogonal waveforms may facilitate a multiple access scheme in which sparse codewords of multiple layers of devices are overlaid in code and power domains and carried over shared time-frequency resources. Typically, the multiplexing of multiple devices may become overloaded if the number of overlaid layers is more than the length of the multiplexed codewords.

However, with SCMA, such overloading may be tolerable with moderate complexity of detection thanks to the reduced size of the SCMA multi-dimensional constellation and the sparseness of SCMA codewords. The sparse codewords enable the use of decoders with techniques, such as MPA or MLSE, to be used for detecting codewords from the combined codewords received by the decoders. The MPA and MLSE decoding techniques, however, may not provide the best solution to address concerns regarding complexity of decoding, latency or larger data sequences or codebooks.

SUMMARY

According to one embodiment of the present disclosure, there is provided a method of decoding a sparsely encoded data sequence. The method includes determining a reduced search space for a received signal. The reduced search space is defined by states centred on an estimate of the received signal and within a search threshold determined based on a characteristic related to the received signal or related to the quality of the resource element over which the received signal is received. MPA or MLSE then can be used to further decode the estimate of the received signal using the defined reduced search space.

According to one embodiment of the present disclosure, there is provided a method of decoding a sparsely encoded data sequence. The method includes receiving one or more sparsely encoded data sequences in a plurality of received signals over a corresponding plurality of resource elements, wherein each received signal is associated with a plurality of possible states based on a plurality of predefined sparsely encoded data sequences associated with the each received signal; generating an estimate for each received signal; determining a reduced search space for the estimate, the reduced search space comprising a number of states within a search threshold from the estimate, the search threshold being based on a characteristic related to received signal and/or to a quality of a resource element over which the received signal is transmitted; and decoding the estimate within the reduced search space to recover the one or more sparsely encoded data sequences.

According to one embodiment of the present disclosure, the characteristics related to received signal and/or to the quality of the resource element include signal to noise ratio (SNR), signal power level $s_n$, channel factor estimate $h_n'$, channel factor to noise ratio $$\frac{|h n'|^2}{|N_0|^2},$$

or combinations thereof. The reduced search space of a first received signal estimate associated with a higher signal to noise ratio (SNR), a higher signal power level $s_n$, a higher channel factor estimate $h_n'$, or a higher channel factor to noise ratio $$\frac{|h n'|^2}{|N_o|^2}$$

has fewer states than that of a second received signal estimate associated with a lower signal to noise ratio (SNR), a lower signal power level $s_e$, a lower channel factor estimate $h_n'$, or a lower channel factor to noise ratio $$\frac{|h n'|^2}{|N_o|^2}.$$

According to one embodiment of the present disclosure, the number of possible states associated with the each received signal is at least greater than the number of states of the reduced search space.

According to one embodiment of the present disclosure, the plurality of estimates are decoded using a message passing algorithm (MPA).

According to one embodiment of the present disclosure, decoding the plurality of estimates using the MPA comprises first determining conditional channel probabilities (CCPs) for a reduced set of states associated with each received signal estimate.

According to one embodiment of the present disclosure, the method further comprises receiving a plurality of channel estimates associated with the plurality of resource elements; ranking the plurality of resource elements based, at least in part, upon the channel estimates, thereby producing a ranked list of resource elements; and allocating a predefined reduced search space based on the ranking of its corresponding resource element in the ranked list of resource elements, wherein the predefined reduced search space of a higher channel estimate value $|hn'|^2$ has fewer states.

According to one embodiment of the present disclosure, at least one of the received signals includes an input signal with a known power-boost, and the search space associated with the at least one received signal is further reduced based on the known power-boost.

According to one embodiment of the present disclosure, the reduced search space having states within the search threshold comprises the states having a Euclidean distance within the search threshold of the received signal estimate.

According to one embodiment of the present disclosure, the reduced search space having states within the search threshold comprises the states having a Euclidean distance within the search threshold of the received signal estimate.

According to one embodiment of the present disclosure, the one or more sparsely encoded data sequences comprises one or more sparse code multiple access (SCMA) codewords, and the plurality of predefined sparsely encoded data sequences associated with the particular received signal comprises one or more SCMA codebooks.

According to one embodiment of the present disclosure, the received signals are associated with up to six SCMA codebooks, and the SCMA codewords are spread over four resource elements and have at most two non-zero elements.

According to one embodiment of the present disclosure, there is provided a system for decoding a sparsely encoded data sequence. The system includes: a processor configured to receive instructions to cause the system to execute the methods described above. In some embodiments, the present disclosure describes a non-transitory computer readable medium comprising instructions encoded thereon, the instructions, when executed by a processor of a decoder, causing the decoder to execute the methods described above. In some embodiments, the sparsely encoded data sequence comprises a sparse code multiple access (SCMA) data sequence. In some embodiments, the system comprises a user equipment, base station, a wireless transceiver unit, or other network transmission or reception point.

According to one embodiment of the present disclosure, there is provided a non-transitory computer readable medium comprising instructions encoded thereon. The instructions, when executed by a processor of a decoder, causes the decoder to: receive one or more sparsely encoded data sequences in a plurality of received signals over a corresponding plurality of resource elements, wherein each received signal is associated with a plurality of possible states based on a plurality of predefined sparsely encoded data sequences associated with the each received signal; generate an estimate for each received signal; determine a reduced search space for the estimate, the reduced search space comprising a number of states within a search threshold from the estimate, the search threshold being based on a characteristic related to received signal and/or to a quality of a resource element over which the received signal is transmitted; and decode the estimate within the reduced search space to recover the one or more sparsely encoded data sequences.

It is stated that the embodiments discussed in this application may be combined as new embodiments when applicable. The new combined embodiments should also be considered as disclosed in the application.

BRIEF DESCRIPTION OF THE DRAWINGS

Reference will now be made, by way of example, to the accompanying figures which show example embodiments of the present application, and in which:

FIG. 1A is a block diagram illustrating an example communications system in accordance with one implementation of the present disclosure;

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices and systems for decoding data in a wireless network. While described below with respect to sparse code multiple access (SCMA) systems, the present disclosure also may be applied to other sparsely encoded, codeword based systems.

FIG. 1A illustrates a communications network 100 comprising a plurality of user equipment (UE) 102 and a network node 104. Each of the UE 102 and network node 104 may include a decoder as described herein. The network 100 may operate according to one or more communications or data standards or technologies including but not limited to fifth generation (5G) or fourth generation (4G) telecommunications networks, Long-Term Evolution (LTE), 3rd Generation Partnership Project (3GPP), Universal Mobile Telecommunications System (UMTS) and other wireless or mobile communications networks. The UE 102 generally can be any device capable of providing wireless communications, such as wireless transmit/receive unit (WTRU), mobile station (MS), mobile terminal, smartphone, cellular telephone, or other wireless enabled computing or mobile device. In some embodiments, the UE 102 comprises a machine which has the capability to send, receive, or send and receive data in the communications network 100 but which performs primary functions other than communications. In one embodiment, a machine includes an apparatus or device with means to transmit and/or receive data through the communications network 100 but such apparatus or device is not typically operated by a user for the primary purpose of communications. The network node 104 may comprise a base station (BS), evolved Node B (eNB), or other network interface which functions as a wireless transmission and/or reception point for UE 102 in the network 100. The network node 104 is connected to a backhaul network 110 which enables data to be exchanged between the network node 104 and other remote networks, nodes, access points, and devices (not shown). The network node 104 may support communications with each UE 102 by establishing uplink and downlink communications channels with each UE 102, as represented by the arrows in FIG. 1A. Communications in the network 100 may be unscheduled, scheduled by the network node 104 or by a scheduling or management entity (not shown) in the network 100, or a mix of scheduled and unscheduled communications.

Figure 1B:
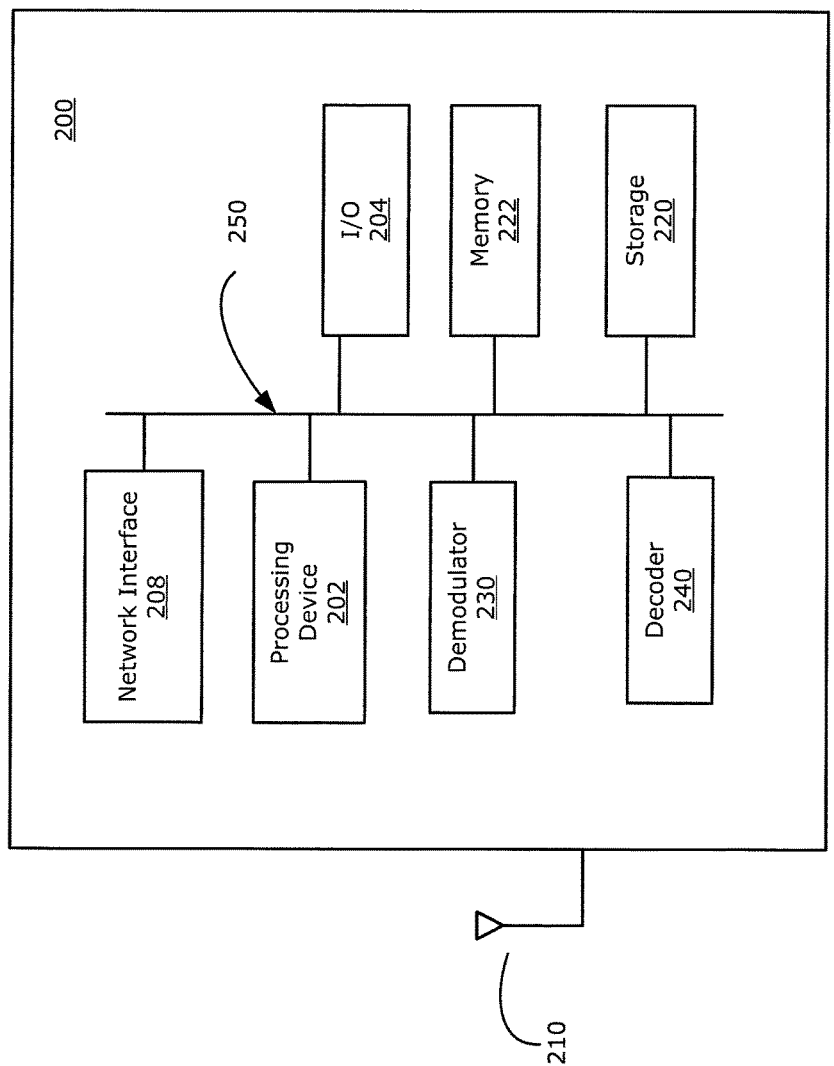
FIG. 1B is a block diagram illustrating an example processing system in accordance with one implementation of the present disclosure.

FIG. 1B illustrates an example processing system 200, which may be used to implement methods and systems described herein, such as the UE 102 or the network node 104. The processing system 200 may be a base station or a mobile device, for example, or any suitable processing system. Other processing systems suitable for implementing the present disclosure may be used, which may include components different from those discussed below. Although FIG. 1B shows a single instance of each component, there may be multiple instances of each component in the processing system 200.

The processing system 200 may include one or more processing devices 202, such as a processor, a microprocessor, an application-specific integrated circuit (ASIC), a field-programmable gate array (FPGA), a dedicated logic circuitry, or combinations thereof. The processing system 200 may also include one or more input/output (I/O) interfaces 204, which may enable interfacing with one or more appropriate input devices and/or output devices (not shown). One or more of the input devices and/or output devices may be included as a component of the processing system 200 or may be external to the processing system 200. The processing system 200 may include one or more network interfaces 208 for wired or wireless communication with a network, such as but not limited to, an intranet, the Internet, a P2P network, a WAN, LAN and/or a cellular or mobile communications network such as a 5G, 4G, LTE or other network as noted above. The network interface(s) 208 may include wired links (e.g., Ethernet cable) and/or wireless links (e.g., one or more antennas) for intra-network and/or inter-network communications. The network interface(s) 208 may provide wireless communication via one or more transmitters or transmitting antennas, one or more receivers or receiving antennas, and various signal processing hardware and software, for example. In this example, a single antenna 210 is shown, which may serve as both transmitting and receiving antenna. However, in other examples there may be separate antennas for transmitting and receiving. The network interface(s) 208 may be configured for sending and receiving data to the backhaul network 110 or to other user devices, reception points, transmission points, network nodes, gateways or relays (not shown) in the network 100.

The processing system 200 may also include one or more storage units 220, which may include a mass storage unit such as a solid state drive, a hard disk drive, a magnetic disk drive and/or an optical disk drive. The processing system 200 may include one or more memories 222, which may include a volatile or non-volatile memory (e.g., a flash memory, a random access memory (RAM), and/or a read-only memory (ROM)). The non-transitory memory(ies) 222 may store instructions for execution by the processing device(s) 202, such as to carry out the present disclosure. The memory(ies) 222 may include other software instructions, such as for implementing an operating system and other applications/functions. In some examples, one or more data sets and/or module(s) may be provided by an external memory (e.g., an external drive in wired or wireless communication with the processing system 200) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

The processing system 200 may include a demodulator 230 and a decoder 240, for processing a received signal. The demodulator 230 may perform demodulation on a received modulated signal (e.g., a 16-QAM signal). The decoder 240 may then perform appropriate decoding on the demodulated signal, in order to recover the original signal contained in the received signal. In some examples, instructions coded in the memory 222 may configure processing device 202 to perform the functions of the demodulator 230 and/or the decoder 240, such that the demodulator 230 and/or the decoder 240 may not be distinct modules of the processing system 200. In some examples, the demodulator 230 and the decoder 240 may be embodied within a receiver module in the processing system 200. In some examples, the receiving antenna 210, demodulator 230 and decoder 240 may be embodied as a receiver component external to the processing system 200, and may simply communicate the signal decoded from the received signal to the processing system 200.

There may be a bus 250 providing communication among components of the processing system 200, including the processing device(s) 202, I/O interface(s) 204, network interface(s) 208, storage unit(s) 220, memory(ies) 222, demodulator 230 and decoder 240. The bus 250 may be any suitable bus architecture including, for example, a memory bus, a peripheral bus or a video bus.

Communications between UE 102 and the network node 104 in the network 100 may be implemented by encoding data to be transmitted using sparse data encoding techniques such as SCMA. SCMA codewords are provided in a set of codebooks and are used for mapping information or signals directly to a multi-dimensional codeword. Each codebook may be associated with a different layer over which multiple data streams may be communicated over shared physical resources in the network 100. Each layer or codebook may be associated with or assigned to a UE 102 in the network 100 such that the network node 104 and the user device 102 have knowledge of the codebook used to encode the information/signal associated with a transmitted signal.

SCMA Encoding

Figure 2:
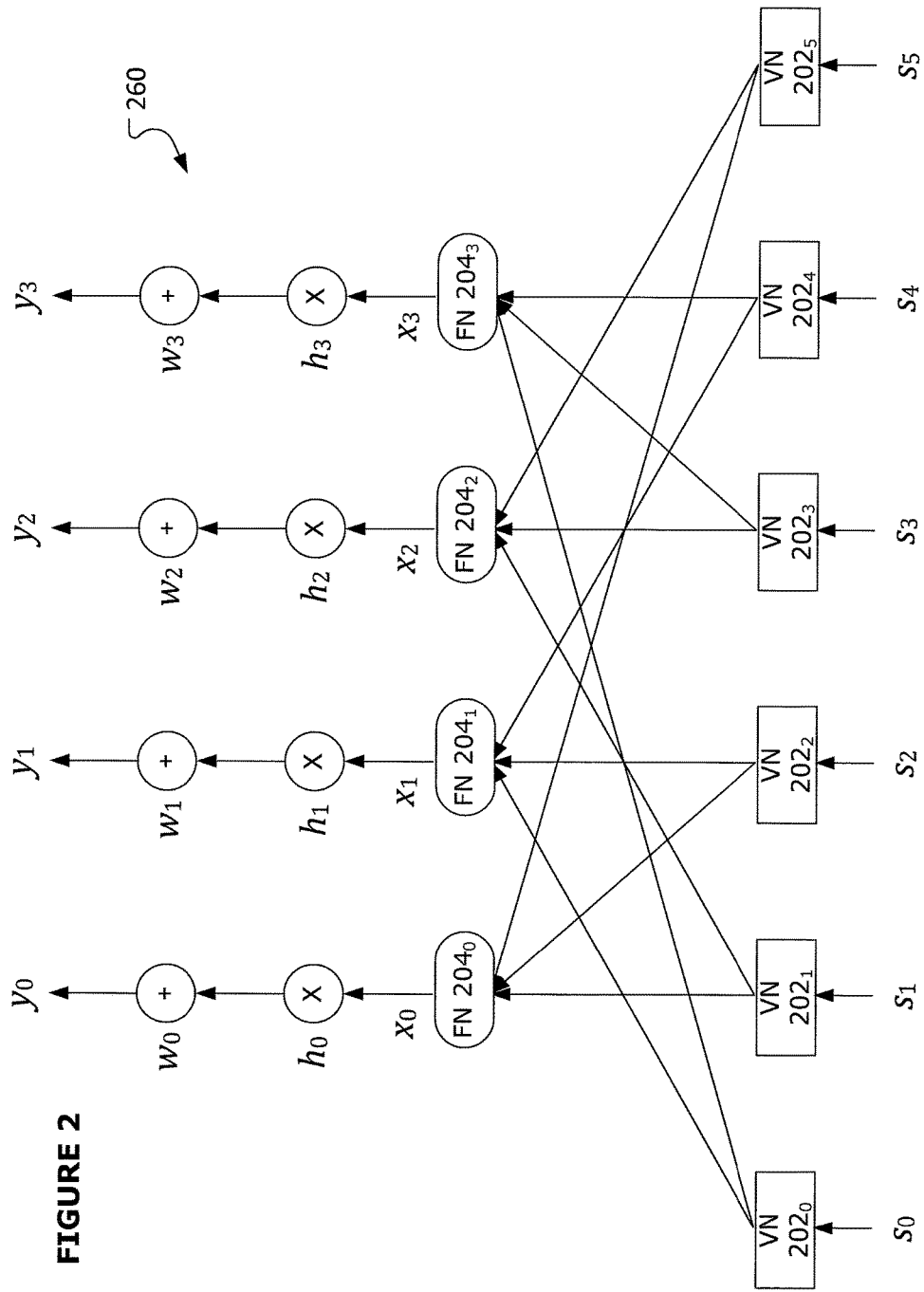
FIG. 2 is a diagram illustrating an example SCMA encoding process.

FIG. 2 is a diagram illustrating an example SCMA encoding process. There are J input signals ($s_i$), in this example J=six (6), which are inputs to the variable nodes (VN), individually VN $202_0$; VN $202_1$; VN $202_2$; VN $202_3$; VN $202_4$; and VN $202_5$. Although six signals are shown, there may be more or fewer signals in other examples. Each of the signals $s_i$ is coded with a codeword from a SCMA codebook, and spread onto different resource elements, which in this case are subcarriers or channels with orthogonal frequency-division multiplexing (OFDM) scheme. The number of subcarriers is K, and in this example K=4. The subcarriers are each modulated and transmitted from what may be referred to as functional nodes (FN), individually FN $204_0$; FN $204_1$; FN $204_2$; and FN $204_3$. The connections between VNs and FNs may be referred to as edges. In the example shown in FIG. 2, each VN 202 receives one of J input signals ($s_i$), maps the input signal to a codeword $C_j(k)$ from a codebook (in which there are M codewords), and transmits dv codeword elements to dv FNs 204. When M=16 codewords is used, each signal $s_i$ is represented by 4 bits. Responsive to receiving multiple codewords, each FN 204 combines $d_f$ received codewords to form a signal referred to as $x_n$, in this example $x_0$, $x_1$, $x_2$, and $x_3$. The SCMA codewords are sparsely distributed. For a codeword $C_j(k)$ with K elements, only $d_v$ ($d_v$<K) elements are non-zero. At each FN 204, only $d_f$ non-zero codewords contribute to the signal $x_n$. Each FN 204 then transmits the signal $x_n$ using a resource element, a subcarrier, or a channel with OFDM scheme in this example.

As each of the signals $x_n$ are combined with $d_f$ received codewords, each of the signals $x_n$ corresponds to a codeword of a codebook with $M^{d_f}$ codewords. FIG. 2 illustrates an example SCMA system with the parameters: K=4, J=6, $d_v$=2, $d_f$=3 and M=16. In the example of FIG. 2, each of a the combined signals $x_0$, $x_1$, $x_2$, and $x_3$ corresponds to a codeword of a codebook with $16^3$ codewords.

Notably, there are fewer FNs than VNs, meaning a greater number of signals are being carried over a fewer number of resources, for example subcarriers. This leads to the problem of how to recover the input signals from the subcarriers, which may be classed as a nondeterministic polynomial (NP) problem.

Signal Pre-Processing

Each of the signals $x_n$ transmitted from one respective FN via a resource element is further influenced by a corresponding channel factor and a corresponding noise factor. Both factors are associated with the resource element. The channel factors generally are related to channel quality of a particular resource element, including signal fading and noise that are specific to the resource element. Therefore, each of the received signals $y_n$, in the example of FIG. 2, $y_0$, $y_1$, $y_2$, $y_3$, contains the elements of the respective signal $x_n$ (in this example, $x_0$, $x_1$, $x_2$, $x_3$), the respective channel factor $h_n$ (in this example, $h_0$, $h_1$, $h_2$, $h_3$), and the respective noise factor $w_k$ (in this example, $w_0$, $w_1$, $w_2$, $w_3$), which is specific to each resource element. The received signals $y_n$ may be denoted as $y_n = x_n * h_n + w_n$, as illustrated in FIG. 2.

After the signals $y_n$ are received at the decoder, each of the received signals $y_n$ is pre-processed to remove the influence of the channel factors $h_n$. In particular, in one or more receiver(s) or decoder(s), a reverse operation is performed on each of the received signals $y_n$ to minimize the influence of the respective channel factor $h_n$. First, a channel estimator determines a channel estimate $h_n'$ for each resource element. Second, a received signal estimate $y_n'$ is then determined by applying a reverse operation of the channel estimate $h_n'^{-1}$, for example, the received signal estimate $y_n' = y_n * h_n'^{-1}$, or $y_n' = (x_n * h_n + w_n) * h_n'^{-1}$. The channel estimator will be further discussed in FIG. 5.

Defining Reduced States

Because each of the transmitted signals $x_n$ experiences a distinct signal power level, and distinct channel conditions associated with a resource element over which the signal $x_n$ is transmitted, each of the received signal $y_n$ may thus have distinct characteristics related to the received signal or related to the quality of the resource element over which the received signals are received, such as signal to noise ratio (SNR), signal power level $s_n$, channel estimate factor $h_n'$, or channel factor to noise ratio $$\frac{|hn'|^2}{|N_o|^2}.$$

The SNR may be represented by a ratio with contributions from the signal power level $s_n$ of the received signal $y_n$ and an estimated noise $$N_o, \frac{|s_n|^2}{|N_o|^2}.$$

The estimated noise $N_o$ is a noise level that represents the average noise level of the environment in which the signal $x_n$ is transmitted. A received signal $y_n$ having a higher SNR value may be considered to be decoded with a greater degree of certainty than those received signal having a lower SNR. Thus, each signal and the search space of the possible states associated with each signal do not contribute equally to the final decoded results. For a received signal $y_n$ having a higher SNR, states farther from the estimated received signal $y_n'$ may not be addressed by MPA or MLSE algorithms.

In one embodiment of the present application, the search space associated with an estimate of a received signal $y_n$ is reduced as a function of its SNR, with a search threshold $f_n = f(SNR)$. Generally, if the SNR of a first received signal $y_1$ is higher that of a second received signal $y_2$, the search threshold of received signal $y_1$ is smaller than that of the second received signal $y_2$. As a result, the first search space of the corresponding estimate of the first received signal $y_1'$ may be smaller than the search space of the corresponding estimate of the second received signal $y_2'$.

A received signal $y_n$ having a higher signal power level $s_n$ may be considered to be decoded with a greater degree of certainty than those received signals having a lower signal power level $s_n$. In one embodiment, the search space associated with an estimate of a received signal $y_n$ is reduced as a function of the signal power level $s_n$, with a search threshold $f_n = f(s_n)$. Generally, if the $s_n$ of a first received signal $y_1$ is higher than that of a second received signal $y_2$, the search threshold of the first received signal $y_1$ may be smaller than that of the second received signal $y_2$. As a result, the first search space of the estimate of the first received signal $y_1'$ may be smaller than the search space of the estimate of the second received signal $y_2'$.

In one embodiment, it may be assumed that the original signals $s_0$, $s_1$, $s_2$, $s_3$, $s_4$ and $s_5$ are transmitted with equal power. In another embodiment, the power used to transmit some selected original signals $x_n$ may be offset or booted (amplified) relative to the power level used to transmit the remaining original signals. The selected signals that are amplified may be known to the RS-MPA decoder 500 of FIG. 5. A signal that is boosted/amplified generally has stronger received signal power level than a signal that is not boosted, and therefore has a higher SNR with a given noise level. As such, a received signal $y_n$ with a power boost will have a search threshold smaller relative to the search threshold which was determined based on the received signal $y_n$ without power boost. As a result, the search space of the estimate of the received signal $y_n'$ with a power boost may be smaller than the search space of the estimate of the received signal $y_n'$ without a power boost.

Because each of the transmitted signals $x_n$ experiences a distinct channel with a distinct noise contribution, the condition of the channel may also affect the definition of a search space associated with a FN and received signal $y_n$. These experienced conditions may be represented by a ratio with contributions from the channel estimate $h_n'$ and estimated noise $$N_o, \frac{|hn'|^2}{|N_o|^2}.$$

Due to frequency-selectivity of a fading channel, this ratio may be found to be distinct for each of the signals $y_n$ received on one of the subcarriers. However, since white noise on the subcarriers may be viewed as uniform, hn may be used herein in place of $$\frac{|hn'|^2}{|N_o|^2}.$$

The partition-set of predefined search space sizes may be allocated to the FNs associated with the received signals $y_n$ according to a ranking of channel estimate $h_n'$ and associated values of the channels over which the signals are received.

For FNs associated with a higher $|hn'|^2$, which indicates a better quality of the channel, the search space associated with an estimate of a received signal $y_n$ may be limited to a reduced or smaller number of states. For FNs associated with a lower $|hn'|^2$, the search space associated with an estimate of a received signal $y_n$ still may be limited to a reduced number of states, with that number being greater than or equal to the smaller number of states for FNs with higher $|hn'|^2$, but still less than the full set of states, $M^d r$. In one embodiment, the channel and noise information are used in determining the search threshold as described above.

In a further embodiment, the reduced search space for the FN associated with each received signal estimate $y_n'$ may be determined in accordance with the search threshold $f_n$ in combination with a partition-set of predefined search space sizes. In further embodiments, the channel and noise information may be used to determine and allocate predefine sets or sizes of the search space associated with each FN and received signal $y_n$. The predefined sets may be used in combination with the search threshold to establish a search space for an estimate of a received signal $y_n'$ which contains the fewer states between the search space established by the search threshold $f_n$ and that established by the predefined sets.

A received signal $y_n$ having a higher $$\frac{|hn'|^2}{|N_o|^2}$$

value may be considered to be decoded with a greater degree of certainty than those received signals having lower $$\frac{|hn'|^2}{|N_o|^2}$$

value. In another embodiment, the search space associated with an estimate of a received signal $y_n'$ is reduced as a function of its $$\frac{|hn'|^2}{|N_o|^2},$$

with a search threshold $$fn = f\left(\frac{|hn'|^2}{|N_o|^2}\right).$$

Generally, if the $$\frac{|hn'|^2}{|N_o|^2}$$

of a first received signal $y_1$ is higher that of a second received signal $y_2$, the search threshold of received signal $y_1$ may be smaller than that of the second received signal $y_2$. As a result, the first search space of the corresponding estimate of the first received signal $y_1'$ may be smaller than the search space of the corresponding estimate of the second received signal $y_2'$.

A received signal $y_n$ having a higher channel estimate $|hn'|^2$ value may be considered to be decoded with a greater degree of certainty than those received signals having lower channel estimate $|hn'|^2$ values. In one embodiment, the search space associated with an estimate of a received signal $y_n$ is reduced as a function of the channel estimate $|hn'|^2$, with a search threshold $f_n = f(|hn'|^2)$. Generally, if the $|hn'|^2$ value of a first received signal $y_1$ is higher that of a second received signal $y_2$, the search threshold of received signal $y_1$ may be smaller than that of the second received signal $y_2$. As a result, the first search space of the corresponding estimate of the first received signal $y_1'$ may be smaller than the search space of the corresponding estimate of the second received signal $y_2'$.

In one embodiment, the search space associated with an estimate of a received signal $y_n$ is reduced as a function of a combination $C_n$ of any two or more characteristics related to the received signal or related to the quality of the resource element, such as the SNR of the received signal $y_n$, signal power level $s_n$ of the received signal $y_n$, channel estimate over noise ratio $$\frac{|hn'|^2}{|N_o|^2},$$

or channel estimate $h_n'$, with a search threshold $f_n = f(C_n)$.

In one embodiment, $f_n$ represents a difference or distance from the received signal estimate $y_n'$ and any states within $f_n$ from the received signal estimate $y_n'$ are included the reduced search space or reduced set of possible states for decoding the received signal estimate $y_n'$.

Figure 3A:
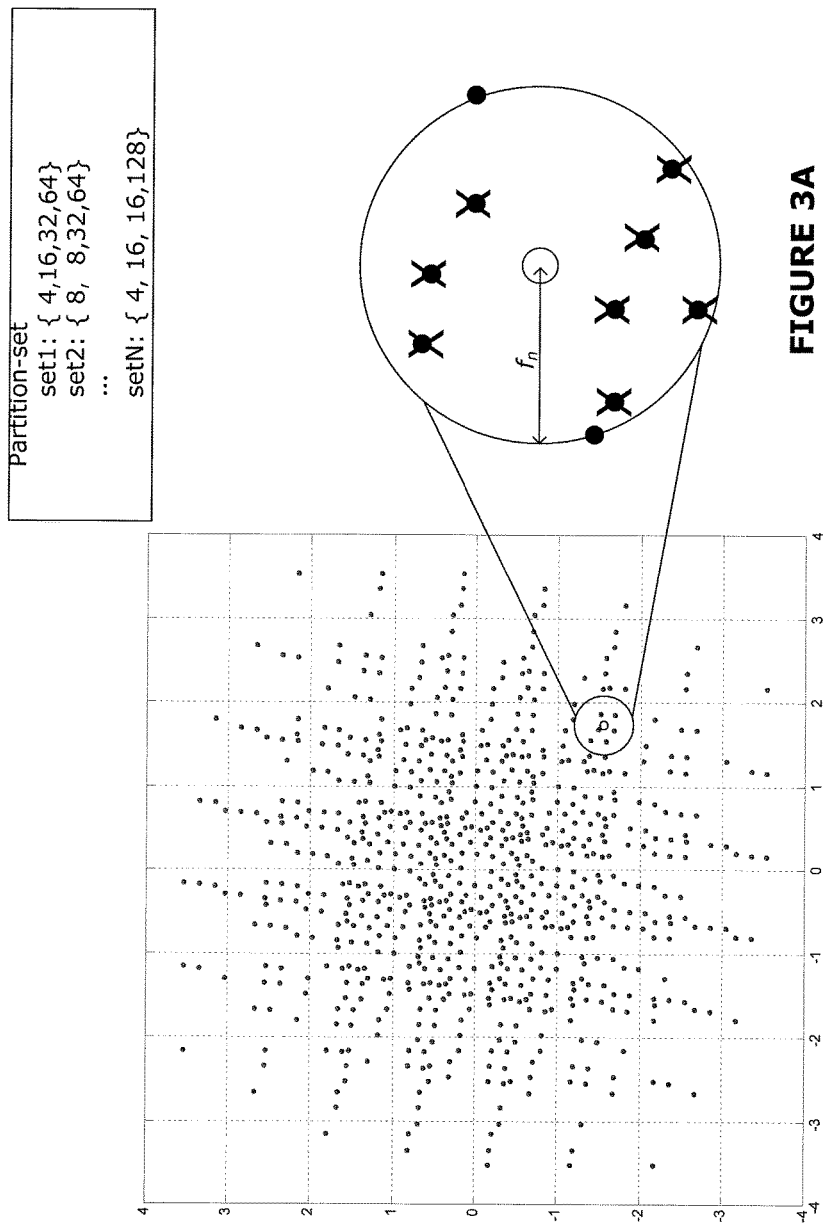
FIGS. 3(a) and (b) are block diagrams illustrating example uses of a reduce search space according to the present disclosure.
Figure 3B:
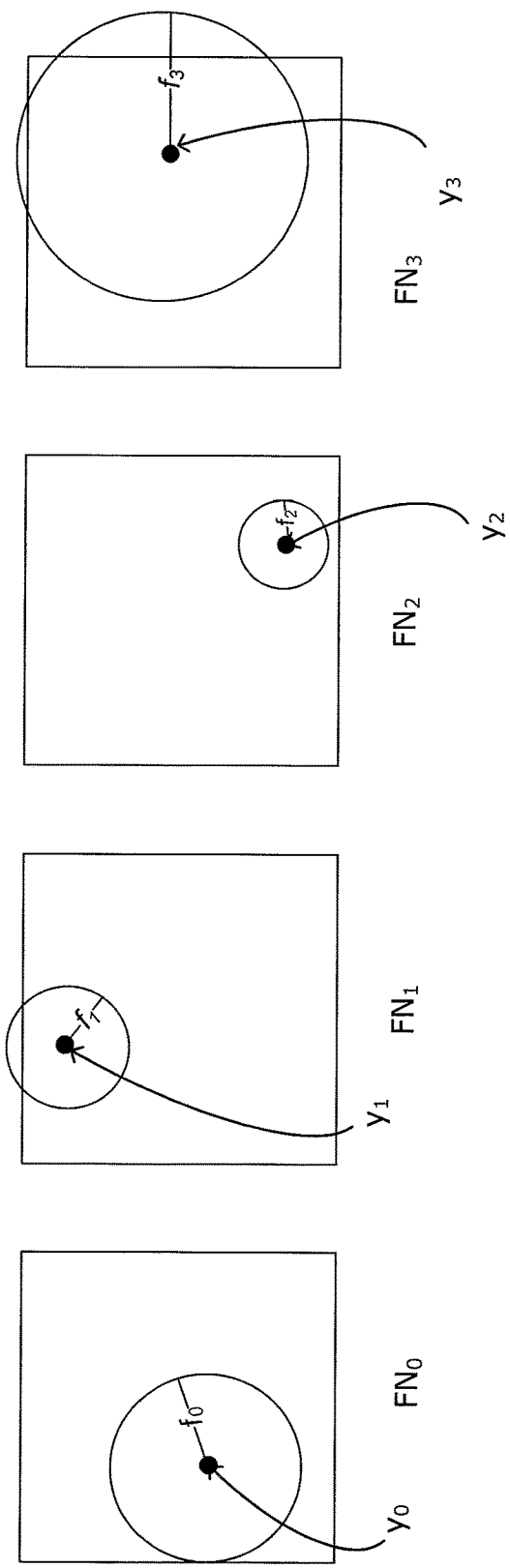

In one embodiment, the reduced search space may be defined as a circular area, with the relative position of the received signal estimate $y_n'$ as the center of the circle and the $f_n$ as the radius of the circle, as shown in FIGS. 3A and 3B. In another embodiment, the reduced search space may be defined as a rectangular area with the relative position of the received signal estimate $y_n'$ as the center of the rectangular area and with $2f_n$ as the sides the rectangular area.

Thus, in one embodiment, for FNs associated with a received signal $y_n$ having a higher SNR, signal power level $s_n$, channel estimate over noise ratio $$\frac{|hn'|^2}{|N_o|^2},$$

channel estimate $h_n'$, or a combination thereof, the search space for FN operations may be limited to a reduced or smaller number of states. For FNs associated with a received signal $y_n$ having a lower SNR, signal power level $s_n$, channel estimate over noise ratio $$\frac{|hn'|^2}{|N_o|^2},$$

channel estimate $h_n'$, the search space for determining FN operations still may be limited to a reduced number of states, but having a greater threshold $f_n$ and greater number of possible states than signals with a higher SNR, signal power level $s_n$, channel estimate over noise ratio $$\frac{|hn'|^2}{|N_o|^2},$$

or channel estimate $h_n'$. In this reduced state algorithm and decoder, complexity is reduced from $O(M^{d_f})$ to $O(S_0+S_1+ \ldots S_{K-1})$, where $S_K$ represents the number of states captured within a threshold $f_n$ associated with each received signal estimate $y_n'$.

FIGS. 3A and 3B are diagrams illustrating example uses of a search threshold to provide reduced search spaces. This example is based on the SCMA encoding example of FIG. 2, in which there are four resource elements or subcarriers and associated FNs. In this example, a search threshold is defined as a function of the SNR associated with a received signal $y_n$ to create an area centered around an estimate of the received signal $y_n'$. Generally, a larger search threshold may provide better performance at the cost of higher complexity in searching the possible or candidate states. As shown in FIG. 3A, only possible states from the predefined codewords which are captured within a threshold distance $f_n$ of an estimate of received signal $y_n'$ are included in the reduced search space for that signal and its associated FN. FIG. 3A illustrates an example search subspace for a received signal associated with $FN_k$, which includes 8 possible or candidate states (crossed-out dark circles) around the estimate of received signal $y_k'$ (white circle), while other states are ignored (dark circles). FIG. 3B provides further examples illustrating that different search thresholds may be determined based on the associated $FN_n$ and the characteristic related to received signal $y_n$ and/or to a quality of a resource element over which the received signal $y_n$ is transmitted, such as a SNR, signal power level $s_n$, channel estimate over noise ratio $$\frac{|hn'|^2}{|N_o|^2},$$

channel estimate $h_n'$, and combinations thereof.

After the reduce search spaces are determined for each of the received signal estimates $y_n'$, the received signal estimates $y_n'$ may be further decoded using MPA or MLSE.

MPA Decoding

In one embodiment, MPA algorithm may be used to decode a set of received SCMA signals $(y_n)$ to obtain a likely set of original signals $(s_j)$.

Because of the sparse nature of the encoded data in an SCMA scheme, in an embodiment, the complexity of decoding the received signal may be reduced somewhat through the use of a message passing algorithm (MPA). After the received signal estimates $y_n'$ are generated, iterative processing is done by passing messages to exchange and update values between FNs and VNs. Each of the connections or edges between the VNs and FNs contain M messages representing the probabilities that the received SCMA codeword being decoded is of each possible codeword in the codebook $C_k$.

In the following example of implementing the reduced states MPA (RS-MPA) decoding algorithm, it is considered that the received signals $y_n$ originated at the SCMA encoder 200 of FIG. 2, with K=4, J=6, dv=2, df=3 and M=16.

Figure 4:
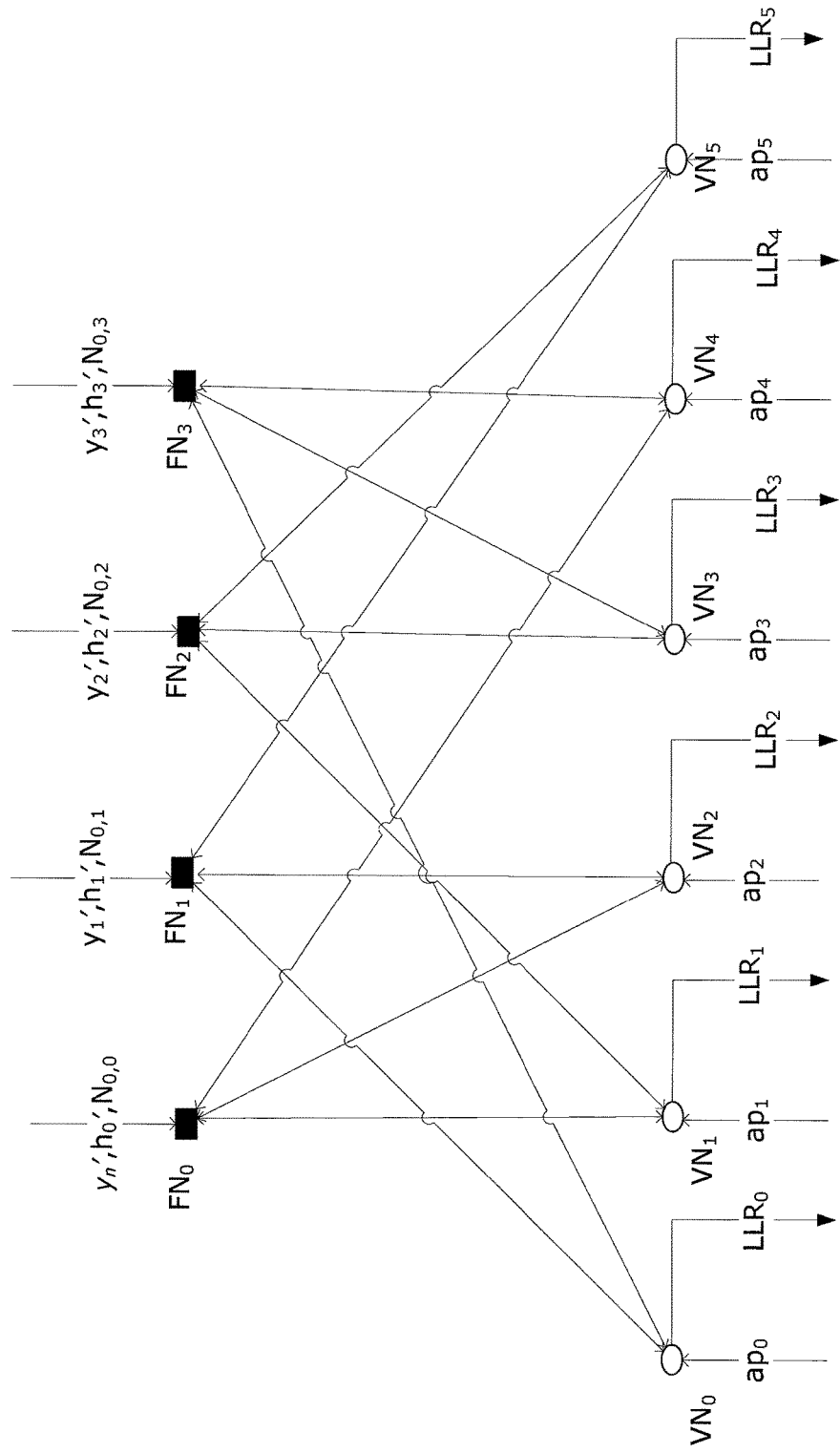
FIG. 4 illustrates a block diagram of a factor graph representation of an SCMA decoding process.

The MPA decoding process may be represented by the example Tanner graph illustrated in FIG. 4. The structure of the graph depends on a number of parameters of the SCMA system design. The parameters of the example structure of FIG. 4 correspond to the parameters noted for the sample encoding process illustrated in FIG. 2. Based on the example codebook design, up to three SCMA codewords have elements overlaid on a particular resource element and thus three VNs connect to each FN. Each codeword may include two non-zero elements and thus two FNs connect to each VN. The $F_{Nn}$ represents the function relating the elements of the VNs that are on subcarrier n, i.e., the resource element $(RE_n)$ to the received signal $y_n$ on this RE. The $VN_J$ represents the transmitted SCMA codeword using the codebook $C_k$. Each $VN_J$ may be initialized with a priori probability values $(ap_k)$ which may equal 1 for an assumption of equal probabilities, or which may be received as feedback from other stages of the decoder or receiver. When messages are passed from a particular VN to its associated FNs, they are based on the messages from the previous decoder iteration from all other FNs connected to the particular VN. When messages are passed from a particular FN to its associated VNs, they are based on the messages from the previous decoder iteration from all other VNs connected to the particular FN.

The messages may be updated and passed in parallel for a number of iterations until the values of $VN_J$ converge to a solution, or until a stopping criteria is met, such as, a maximum iteration count or a sufficient quality of the estimated codeword being reached. A final step may be performed to convert the probabilities at each VN to a log likelihood ratio (LLR) value for each bit in the codeword.

With the traditionally MPA decoding process, the complexity of calculations increases exponentially with M. In the example of FIG. 4, because each of the combined signals $x_n$ corresponds to a codeword of a codebook having $16^3$ codewords, decoding the received signal estimate $y_n'$ requires a search space of $16^3$ states. Further, the process is iterative such that the response time of a conventional MPA decoder may not be acceptable for 5G networks, in which a decoder with very short response time (e.g., about 30 µs) is desired.

Figure 5:
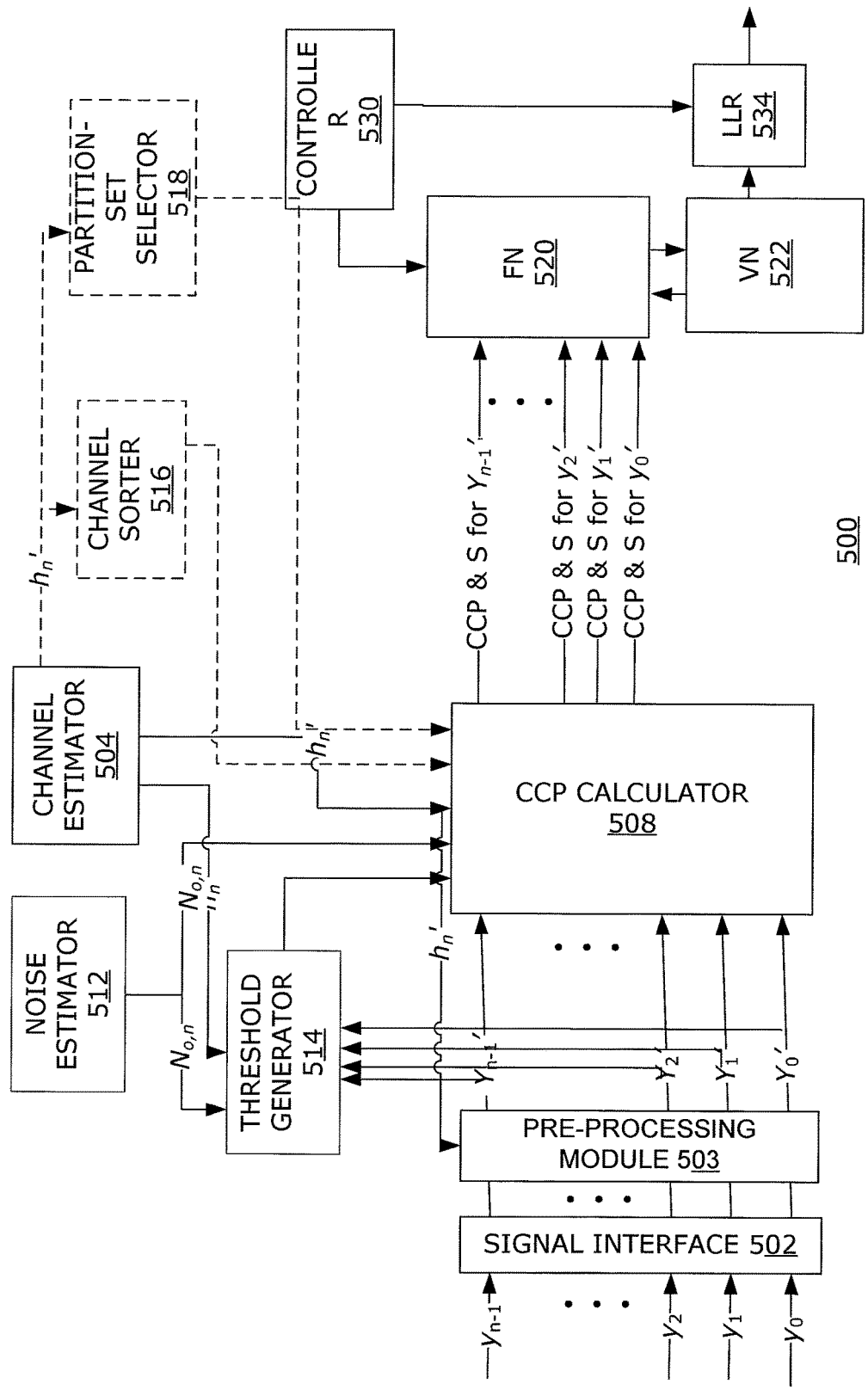
FIG. 5 is a block diagram representing an example implementation of a reduced state MPA (RS-MPA) decoder.

Aspects of the present application involve decoding received signals by implementing an MPA algorithm that has been modified to reduce search space in determining the probabilities for codewords detected in the received signal. An RS-MPA decoder 500 is illustrated in FIG. 5 for implementing an RS-MPA decoding algorithm in accordance with aspects of the present application.

The RS-MPA decoder 500 includes a signal interface 502 adapted to receive a set of received signals $y_n$. The RS-MPA decoder 500 further includes a pre-processing module 503 to minimize the influence of the channel factor $h_n$ on the received signals $y_n$. The RS-MPA decoder 500 further includes a channel estimator 504 that is arranged to receive various signals, for example, pilot, reference or sounding signals, that allow the channel estimator 504 to generate a channel estimate $h_n'$ for each of the resource elements, $RE_n$, such as a subcarrier with OFDM scheme. The pre-processing module 503 receives channel estimate $h_n'$ with respect to each of the received signals $y_n$, and applies a reverse operation of channel estimate $h_n'^{-1}$ on each of the received signals $y_n$ to reverse the influence of the channel factors $h_n$ on each received signals $y_n$. The output of the pre-processed received signals is denoted as $y_n'$. A Conditional Channel Probability (CCP) calculator 508 receives input in the form of the set of received signals estimate $y_n'$ from the signal interface 502, channel estimates $h_n'$ from the channel estimator 504, and noise estimates $N_{o,n}$ from a noise estimator 512. The estimated noise estimated noise $N_{o,n}$ is a noise level that represents the average noise level of the environment in which the signals $x_n$ in FIG. 2 are transmitted. The CCP calculator 508 also receives a search threshold from a threshold generator 514. As discussed previously, the search threshold may be determined based on SNR, received signal power level $s_n$, channel estimate over noise ratio $$\frac{|hn'|^2}{|N_o|^2},$$

channel estimate $h_n'$, or a combination thereof. The search thresholds are used by the CCP calculator 508 to define a reduce search space as described previously.

In one embodiment, the RS-MPA decoder 500 further includes a channel sorter 516 that is arranged to receive output $h_n'$ from the channel estimator 504 and provides input, such as a ranked list of channels based on the estimated channel factors $h_n'$, to the CPP calculator 508.

In a further embodiment, the RS-MPA decoder 500 also includes a partition set selector 518 which also receives output $h_n'$ from the channel estimator 504 and provides input to the CCP calculator 508. Based on the received channel estimates $h_n'$, the partition set selector 518 may selected a set of states for each received signal estimates $y_n$, arranged in the order of $h_n'$, from the highest to the lowest, from a plurality of the predefined sets stored in the partition set selector 518. Each of the states in the selected set is smaller than $M^{df}$. The states of the selected set may be used to define reduced search spaces for the corresponding received signal estimates $y_n'$.

In an embodiment, the inputs of the channel sorter 516 and partition set selector 518 may be used by the CCP calculator 508, in combination with the search threshold from the threshold generator 514, to define a reduced search space. For example, for each received signal estimate $y_n'$, the smallest reduced search space may be selected from the search spaces defined by the corresponding state of the selected partition set and by the search threshold associated with the received signal estimate $y_n'$.

Output from the CCP calculator 508 is received at an FN block 520 and contains a reduced search space or a reduced set of states, rather than the full sets of states $M^{df}$. The FN block 520 operates by updating probabilities for each function node, $FN_n$, for its associated reduced search space, and exchanging messages iteratively with a VN block 522. The VN block 522 is configured to update messages for each edge of each variable node $VN_j$ for the reduced search states. A controller 530 controls the iterations and message passing until a stopping criteria is met, after which the values from the VN block 522 are used to generate a soft output value or decision such as a log likelihood ratio (LLR) at LLR block 534. The LLR values may be provided to a subsequent block or step in the decoder 500, such as a turbo decoder or FEC decoder. In one embodiment, the decoder 500 outputs a hard decision, such as a candidate sequence $(s'_0, s'_1 \ldots s'_J)$.

With the reduced state algorithm and decoder 500, complexity is reduced from $O(M^{df})$ to $O(S_0+S_1+\ldots S_{K-1})$, where $S_K$ represents the number of states captured within a threshold $f_n$ associated with each received signal estimate $y_n'$.

Figure 6:
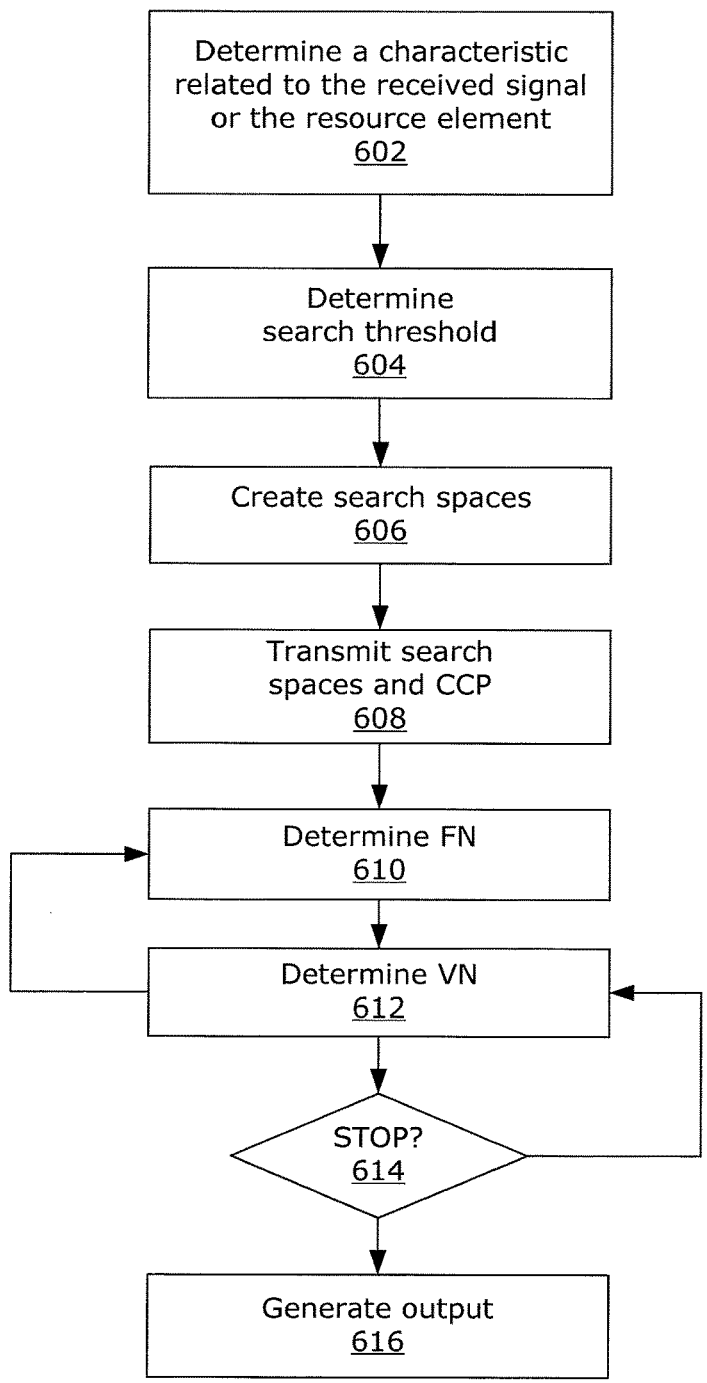
FIG. 6 is a block diagram illustrating example steps in a method implementing an RS-MPA decoding algorithm according to the present disclosure.

FIG. 6 illustrates example steps in a method 600 implementing the RS-MPA decoding algorithm according to an aspect of the present application. Initially, a characteristic related to the received signal or related to the quality of the resource element is determined for each received signal $y_n$ (step 602) and a search threshold $f_n$ is generated as a function of the SNR for each signal (step 604). The characteristic related to the received signal or related to the quality of the resource element may be the SNR of the received signal $y_n$, signal power level $s_n$ of the received signal $y_n$, channel estimate over noise ratio $$\frac{|hn'|^2}{|N_o|^2},$$

channel estimate $h_n'$, or combinations thereof. While these steps may be performed by the threshold generator 514, which is shown separately in FIG. 5, it will be appreciated that the threshold generator 514 may be part of the CCP calculator 508. In one embodiment, the search threshold is generated dynamically for each received signal estimate $y_n'$.

Where, for example, the signal $y_0$ is received over a resource element or subcarrier and is determined to have a particular characteristic related to the received signal or related to the quality of the resource element, such as a SNR, a search threshold $f_0$ is determined and received by the CCP calculator 508. The search space or a reduced set of states for the FN associated with received signal estimate $y_0'$ is created (step 606) based on states captured within a search threshold $f_0$ from the received signal estimate $y_0'$. As illustrated in FIG. 2, the received signal $y_0$ includes contributions from original signals $s_1$, $s_2$ and $s_5$. Based on the possible states or codewords from the codebooks which have been predefined and associated with each layer of data, each user or service, as represented by each VN, i.e. $VN_1$, $VN_2$ and $VN_5$, a reduced set of states may be obtained. The creation of the reduced search space for the received signal estimate $y_0'$ and its associated $FN_0$ includes determining the codeword combinations of $s_1$, $s_2$ and $s_5$, from the possible states or codewords in the associated codebooks, having a CCP or Euclidean distance from $y_0'$ that is within the search threshold $f_0$. CCP values may be determined for the reduced set of states or codeword combinations for $FN_0$ which fall within this threshold.

Similarly, for the received signal $y_1$, where, for example, the signal $y_1$ is received over a resource element or subcarrier and is determined to have a particular characteristic related to the received signal or related to the quality of the resource element, such as a SNR, a search threshold $f_1$ is determined and received by the CCP calculator 508. The search space or a reduced set of states for the FN associated with received signal estimate $y_1'$ is created (step 606) based on states captured within a search threshold $f_1$ from the received signal estimate $y_1'$. As illustrated in FIG. 2, signal $y_1$ includes contributions from original signals $s_0$, $s_2$ and $s_4$. Based on the possible states or codewords from the codebooks which have been predefined and associated with each layer of data or user, as represented by each VN, i.e. $VN_0$, $VN_2$ and $VN_4$, a reduced set of states may be obtained. The creation of the reduced search space for the received signal estimate $y_1'$ and its associated $FN_1$ includes determining the codeword combinations of $s_0$, $s_2$ and $s_4$, from the possible states or codewords in the associated codebooks, having a CCP or Euclidean distance from received signal estimate $y_1'$ that is within the search threshold $f_1$. CCP values may be determined for the reduced set of states or codeword combinations for $FN_1$ which fall within this threshold. These determinations may be repeated to create reduced search spaces for each of the recited signal estimates $y_2'$ to $y_{n-1}'$ and to determine associated CCP values for these reduced sets of states or codewords.

In one embodiment, prior to creating the search spaces (at step 606), the CCP calculator 508 receives a partition-set configuration, generically $\{S_0, S_1, S_2, S_3\}$, which defines the size or minimum number of states for the search spaces for K FNs. The search spaces $S_0, S_1, S_2, S_3$ are arranged in the order from the highest $|hn'|^2$ value to the lowest $|hn'|^2$ value of the received signals $y_n$. Generally, $S_0 <= S_1 <= S_2 <= S_3$. The partition-set may be static, for example $\{16, 24, 32, 64\}$, and, accordingly, may simply be received by the CCP calculator 508 only once. Alternatively, the partition-set may be dynamic. For example, there may be a plurality of pre-configured partition-sets, for example, a first partition-set $\{4, 16, 32, 64\}$, a second partition-set $\{8, 8, 32, 64\}$ and a third partition-set $\{4, 8, 16, 128\}$, with each particular partition-set associated with conditions under which the use of the particular partition-set is preferred. In cases where the dynamic partition-sets are employed, a partition-set for use by the CCP calculator 508 is provided by a partition-set selector 518. The partition-set selector 518 may, for example, select a particular partition-set based on information received from the channel estimator 504 including the $|hn'|^2$ values for each channel and differences among $|hn'|^2$ values. The partition-set selector 718 may, for example, select a particular partition-set based on channel information received from the channel estimator 704. In an embodiment, if the decoder 700 determines that a user is move fast, a partition set with significant changes in the states may be selected; if the decoder 700 determines that a user is move slowly, a partition set with less significant changes in the states may be selected.

In an embodiment, the size or minimum number of states for the search spaces may be determined by characteristics related to the received signal $y_n$ or to the quality of the resource element over which the received signals are received. The characteristics related to the received signal or to the quality of the resource element include, but are not limited to, signal to noise ratio (SNR), signal power level $s_n$, channel factor $h_n$, channel factor to noise ratio $$\frac{|hn'|^2}{|N_o|^2},$$

or combinations thereof. A higher value of signal to noise ratio (SNR), signal power level $s_n$, channel factor $h_n$, and/or channel factor to noise ratio $$\frac{|hn'|^2}{|N_o|^2},$$

may warrant a smaller size or number of states for the search spaces. For example, if received signal $y_1$ has a higher S/N ratio than $y_2$, the size or number of states for the search spaces of $y_1$ may be smaller than the size or number of states for the search spaces of $y_2$.

In another embodiment, the size or minimum number of states for the search spaces may be determined by the types of the service carried on each received signal $y_n$. For example, if the services carried by a first received signal $y_1$, are voice services, and the services carried by a second received signal $y_2$ are data services, because generally voice services are more time-sensitive than data services, the first signal $y_1$ may be determined to have a smaller size or number of states for the search spaces than the second signal $y_2$, in order to reduce the latency of decoding the first signal $y_1$.

To facilitate use of the partition-set, the channels are sorted by the channel sorter 516. More particularly, the channel sorter 516 sorts the channels based on their $|hn'|^2$ value to produce a ranked list. The channel sorter 516 provides the ranked list to the CCP calculator 508 prior to the creation of the search spaces at step 606. Based on the received partition-set configuration and the received ranked list, the CCP calculator 508 may allocate a search space size to each resource element. Based on the allocated search space size, as well as the search threshold received from the threshold generator 514, the CCP calculator 508 then creates (step 606), for each channel n, a search space centered around $y_n'$ that meets both the search threshold and the allocated size criteria. For example, a partition set of $\{4, 8, 16, 128\}$ may be allocated to channels and associated functions nodes $FN_0$, $FN_2$, $FN_1$, $FN_3$, respectively. Where a search space and reduced number of possible states based on the search threshold captures 6 states for $FN_0$, the search states may be further reduced to a size of 4 to match the allocation from the partition set and reduce the number of possible states for $FN_0$ to the four states which are closest to the received signal $y_0$. In a different embodiment, where a search space and reduced number of possible states based on the search threshold captures 60 states for $FN_3$, the search states may be increased to a size of 128 to match the allocation from the partition set and increase the number of possible states for $FN_0$ to the four states which are closest to the received signal $y_0$. In a further embodiment, the reduced spaces allocated in the partition set are used by the CCP calculator 508 to scale or adjust the search threshold for each corresponding received signal to account for both signal noise and channel noise in creating the reduced search space. In a further embodiment, the partition set information may be used along with a known power offset in a transmitted signal $x_n$, as described above, in order to create or adjust the search threshold and associated reduced search space for a received signal $y_n$.

In one embodiment, the CCP calculator 508 also determines CCP values for the reduced set of states associated with each received signal based on an estimate of the received signal $y_n'$, an estimated channel $h_n'$ and an estimated noise $N_{o,n}$. It may be considered that there are many manners in which a CCP may be determined. One example manner for determining CCP involves determining a Euclidean distance between the received signals y and the estimated signal, as follows, with $C_a(\cdot)$, $C_b(\cdot)$, $C_k(\cdot)$ being generic codewords and $\alpha$, $\beta$ and i being codeword indices that range from 0 to M−1:

$$\log(\Phi(y_n, \alpha, \beta, i, N_{o,n}, h_n)) = \frac{1}{N_{o,n}} \|y_h - h_n(C_a(\alpha) + C_b(\beta) + C_k(i))\|^2.$$

Upon completion of the creation (step 606) of the K search spaces and determination of initial CCP values, the CCP calculator 508 may then transmit (step 608) the K search spaces and CCP values for the reduced and allocated search spaces to the FN block 520. In one embodiment, the output from the CCP calculator 508 to the FN block 520 may include search space information, a limited set of codeword indices and associated Euclidean distances.

The MPA algorithm may then proceed with FN values being determined based on the CCP values and messages received from associated VNs (step 610) and VNs being updated based on messages received from associated FNs (step 612). In one embodiment, the FN values are updated according to:

$$I_{c_n \to q_a}(i) = \max_{\kappa,\beta}(\log(\phi_n(y_n, \kappa, \beta, i, N_{o,n}, h_n)) + I_{q_k \to c_n}(\kappa) + I_{q_b \to c_n}(\beta)),$$

$$i = 1, \ldots, |C_a|$$

$$I_{c_n \to q_b}(i) = \max_{\kappa,\alpha}(\log(\phi_n(y_n, \kappa, \alpha, i, N_{o,n}, h_n)) + I_{q_k \to c_n}(\kappa) + I_{q_a \to c_n}(\alpha)),$$

$$i = 1, \ldots, |C_b|$$

$$I_{c_n \to q_k}(i) = \max_{\alpha,\beta}(\log(\phi_n(y_n, \alpha, \beta, i, N_{o,n}, h_n)) + I_{q_k \to c_n}(\alpha) + I_{q_b \to c_n}(\beta)),$$

$$i = 1, \ldots, |C_k|$$

In one embodiment, the FN values are updated according to:

$$I_{q_k \to c_n}(i) = I_{c_n \to q_k}(t), t=1, \ldots, |C_k|$$

In the above equations, $I_{c \to q}$ represents messages passed from FNs to VNs, and $I_{q \to c}$ represents the messages passed from VNs to FNs. As the FN values and VN values are updated and passed, however, the probabilities are updated over a reduced number of states, thus reducing the complexity of the FN block 520 and VN block 522.

The MPA process continues iteratively until the controller 430 determines a stopping criteria has been met (step 614).

The output of the decoder 500 is generated (step 616), by computing for each VN, the probability that it is one of its M possible SCMA codewords using the messages from the 2 FNs to which it is connected, as follows equation for $VN_k$:

$$Q_k(i) = ap_k(i) \prod_{m \in z(k)} I_{c_m \to q_k}(i),$$

$$i = 1, \ldots, |C_k|.$$

In one embodiment, the decoder 500 outputs a hard decision, such as a candidate sequence ($s'_0$, $s'_1$ . . . ) for the receive signals. In some embodiments, LLR values are generated for each bit in the codeword based on the probabilities at each VN, as follows:

$$LLR_x = \log\left(\sum_{i, u_{i,z}=0} Q_k(i)\right) - \log\left(\sum_{i, u_{i,z}=1} Q_k(i)\right).$$

As such, if the LLR value of a bit is greater than 0 (>0), this denotes that the bit is more likely to have a value of "0" and is determined accordingly.

MLSE Decoding

In one embodiment, MLSE algorithm may be used to decode a set of received signals $y_n$ to obtain a likely set of original signals ($s_J$). Because each one of the J original signals $s_J$ may be encoded as one of M codewords, the search space having a size of $M^J$ may be defined for a non-modified MLSE algorithm. In the Example of FIG. 2, the search space may have a size of $16^6$. As such, a brute-force implementation of an MLSE algorithm may be impractical.

Accordingly, aspects of the present application involve decoding received sparsely encoded signals, such as SCMA signals, by implementing an MLSE algorithm that has been modified decode a received signal $y_n$ with a reduced search space.

Aspects of the present application involve decreasing each of the $M^J$ search spaces into much smaller search spaces. Aspects of the present application also involve beginning an MLSE decoding algorithm with the best-quality received signal before moving through the remaining poorer-quality signals. Conveniently, the previously decoded signals dynamically impact effort necessary to decode the remaining signals.

This modified MLSE may be termed a "Reduced-State MLSE" (RS-MLSE) algorithm.

In the following example of implementing the RS-MLSE decoding algorithm, it is considered that the received signals originated at the SCMA encoder 200 of FIG. 2, with K=4, J=6, dv=2, df=3 and M=16.

Figure 7:
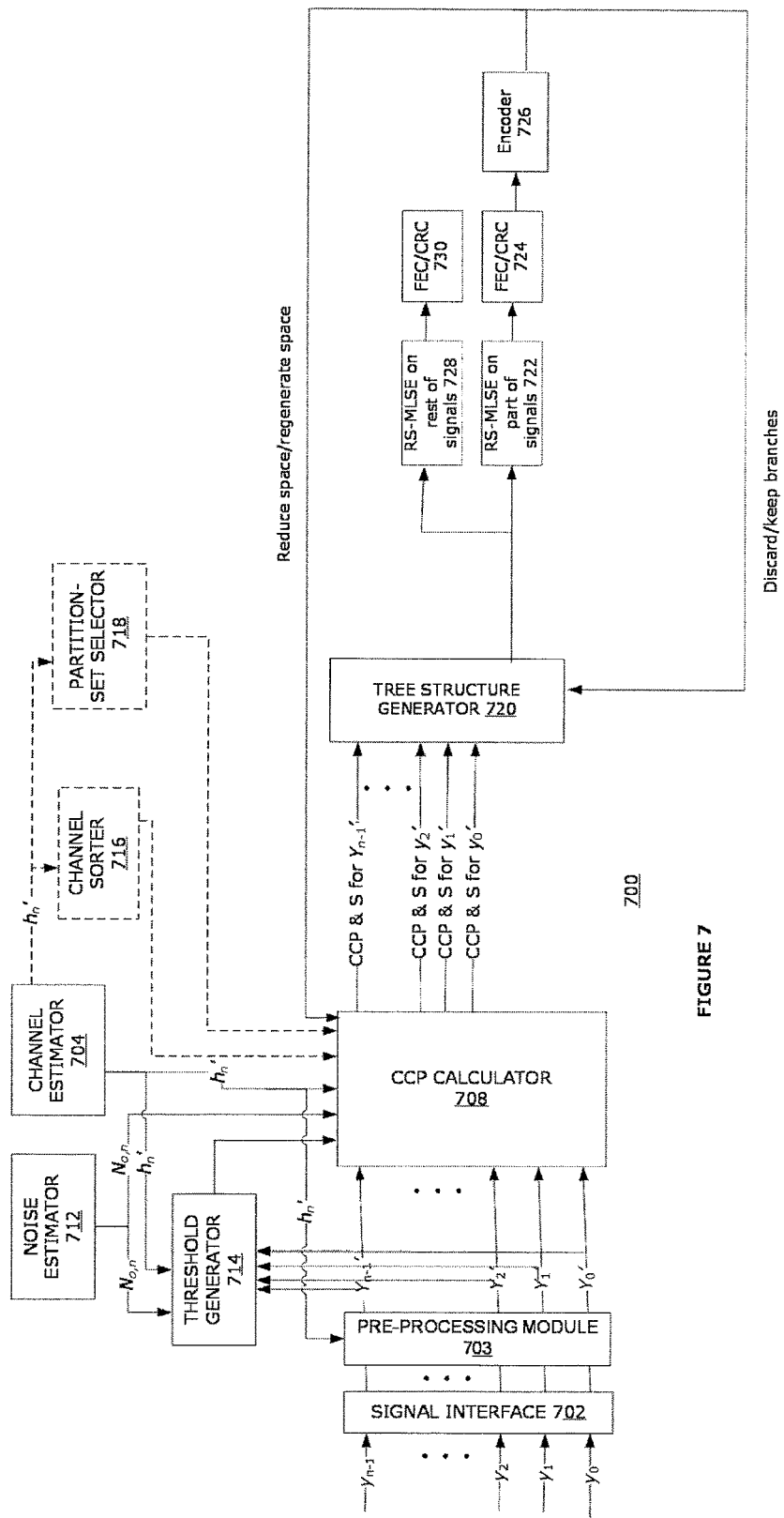
FIG. 7 is a block diagram representing an example implementation of a Reduced State MLSE (RS-MLSE) decoder.

An RS-MLSE decoder 700 is illustrated in FIG. 7 for implementing an RS-MLSE decoding algorithm in accordance with aspects of the present application.

The RS-MLSE decoder 700 includes a signal interface 702 adapted to receive a set of received signals $y_n$. The RS-MLSE decoder 700 further includes a pre-processing module 703 to minimize the influence of the channel factor $h_n$ on the received signals $y_n$. The RS-MLSE decoder 700 further includes a channel estimator 704 that is arranged to receive various signals, for example, pilot, reference or sounding signals, that allow the channel estimator 704 to generate a channel estimate $h_n'$ for each of the resource elements, $RE_n$, such as a sub-carrier with OFDM scheme.

The pre-processing module 703 receives channel estimate $h_n'$ with respect to each of the received signals $y_n$, and applies a reverse operation of channel estimate $h_n'^{-1}$ on each of the received signals $y_n$ to reverse the influence of the channel factors $h_n$ on each received signals $y_n$ to generate corresponding received signal estimates $y_n'$, for example, $y_n' = y_n * h_n'^{-1}$, or $y_n' = (x_n * h_n + w_n) * h_n'^{-1}$. A Conditional Channel Probability (CCP) calculator 708 receives input in the form of the set of received signals estimate $y_n'$ from pre-processing module 703, channel estimates $h_n'$ from the channel estimator 704, and noise estimates $N_{o,n}$ from a noise estimator 712. The estimated noise estimated noise $N_{o,n}$ is a noise level that represents the average noise level of the environment in which the signals $x_n$ in FIG. 2 are transmitted. The CCP calculator 708 also receives a search threshold from a threshold generator 714. As discussed previously, the search threshold may be determined based on characteristic related to the received signal or related to the quality of the resource element, for example, SNR, received signal power level $s_n$, channel estimate over noise ratio $$\frac{|hn'|^2}{|N_o|^2},$$

channel estimate $h_n'$, or combinations thereof. The search thresholds may be used by the CCP calculator 708 to define a reduce search space for each of the received signal estimates $y_n'$ and thus define reduced states as described previously. The defined reduced search states for each signal estimate $y_n'$ may form the elements of the partition set. Alternatively, the partition set may also be predefined by the decoder 700.

In one embodiment, the RS-MLSE decoder 700 further includes a channel sorter 716 that is arranged to receive output $h_n'$ from the channel estimator 704 and provides input, such as a ranked list of channels based on the estimated channel factors $h_n'$, to the CPP calculator 708.

In a further embodiment, the RS-MLSE decoder 500 also includes a partition set selector 718 which also receives output $h_n'$ from the channel estimator 704 and provides input to the CCP calculator 708. Based on the received channel estimates $h_n'$, the partition set selector 718 may selected a set of states for each received signal estimates $y_n$, arranged in the order of $h_n'$, from the highest to the lowest, from a plurality of the predefined sets stored in the partition set selector 718. Each of the states in the selected set is smaller than $M^{df}$. The states of the selected set may be used to define reduced search spaces for the corresponding received signal estimates $y_n'$.

In an embodiment, the inputs of the channel sorter 716 and partition set selector 718 may be used by the CCP calculator 708, in combination with the search threshold from the threshold generator 714, to define a reduced search space. For example, for each received signal estimate $y_n'$, the smallest reduced search space may be selected from the search spaces defined by the corresponding state of the selected partition set and by the search threshold associated with the received signal estimate $y_n'$.

Output from the CCP calculator 708 is received at a tree structure generator 720, whose output may be either a hard decision, such as a candidate sequence ($s'_0, s'_1 \ldots$), or a soft decision, such as a Logarithmic Likelihood Ratio (LLR) for the channel decoder.

In operation of the RS-MLSE decoder 700 of FIG. 7, output of the pre-processed signal estimates $y_n'$ from the pre-processing module 703 is received by the CCP calculator 708. The CCP calculator 308 is arranged to, in operation, determine a CCP when given a received signal estimates $y_n'$, an estimated channel $h_n'$ and an estimated noise $N_{o,n}$. It may be considered that there are many manners in which a CCP may be determined. One example manner for determining CCP involves determining a Euclidean distance, as follows, $$\log(\Phi(y_n, \alpha, \beta, i, N_{o,n}, h_n)) = \frac{1}{N_{o,n}} \| y_h - h_n(C_a(\alpha) + C_b(\beta) + C_k(i)) \|^2.$$

Notably, for a single received signal $y_n$, the determination of CCP may be repeated for $M^{df}$ different states. When M=16 and df=3, the number of states is 4096. Furthermore, $C_a(\bullet)$, $C_b(\bullet)$, $C_k(\bullet)$ are generic codewords and $\alpha$, $\beta$ and i are codeword indices that range from 0 to M−1.

Figure 8:
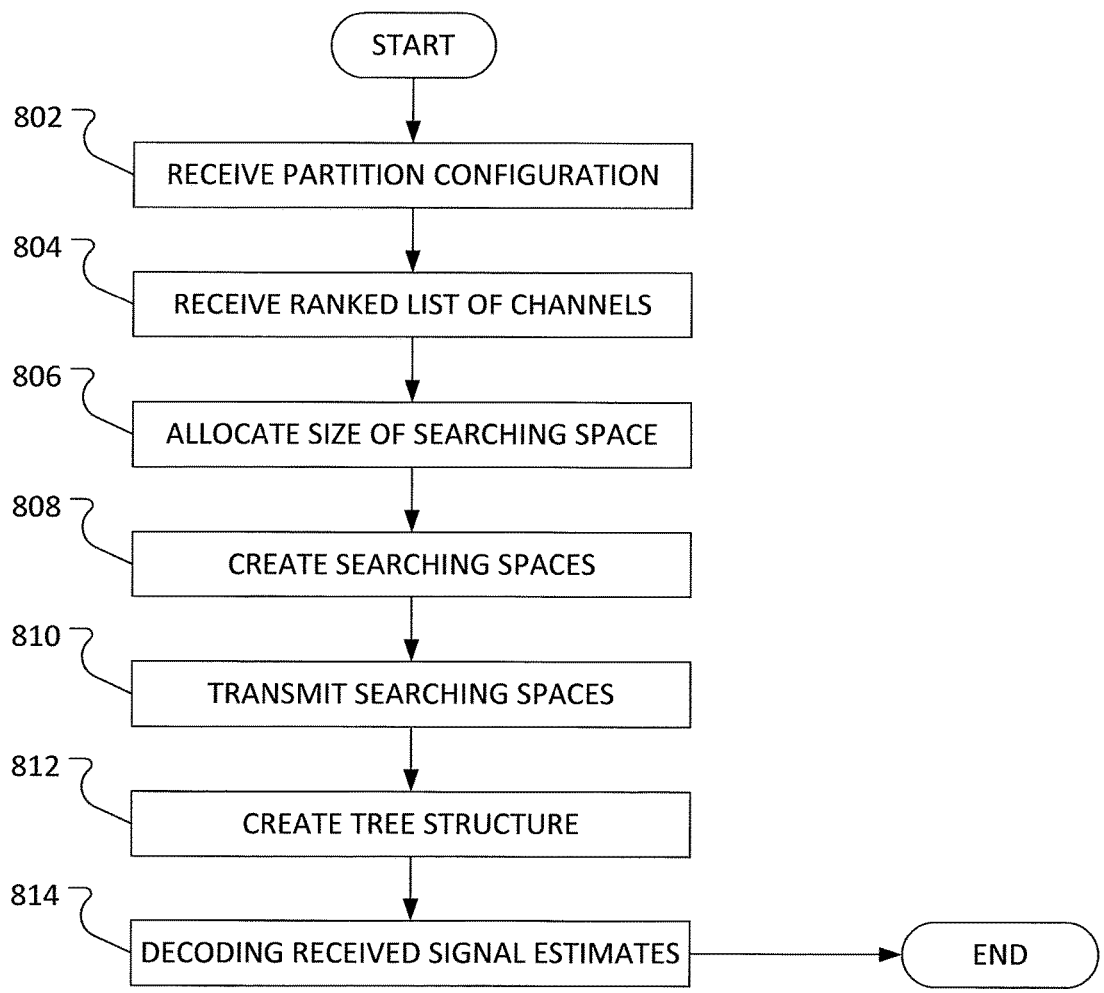
FIG. 8 is a block diagram illustrating example steps in a method implementing an RS-MLSE decoding algorithm according to the present disclosure.

FIG. 8 illustrates example steps in a method implementing the RS-MLSE decoding algorithm according to an aspect of the present application. Initially, partitioning of the overall search space is configured. That is, the CCP calculator 708 receives (step 802) a partition-set configuration, generically {S0, S1, S2, S3}. The elements of partition-set configuration S0, S1, S2, S3 may be determined based on the reduces states defined by $y_n'$ and search threshold as discussed previously, or predefined by the decoder 700. The partition-set may be static, say {16, 24, 32, 64}, and, accordingly, may simply be received by the CCP calculator 708 only once. Alternatively, the partition-set may be dynamic. For example, there may be a plurality of pre-configured partition-sets, say, a first partition-set {4,16,32, 64}, a second partition-set {8,8,32,64} and a third partition-set {4,16,16,128}, with each particular partition-set associated with conditions under which the use of the particular partition-set is preferred. If the dynamic partition-sets are used, a partition-set for use by the CCP calculator 708 may be provided by the partition-set selector 718. The partition-set selector 718 may, for example, select a particular partition-set based on channel information received from the channel estimator 704. In an embodiment, if the decoder 700 determines that a user is move fast, a partition set with significant changes in the states may be selected; if the decoder 700 determines that a user is move slowly, a partition set with less significant changes in the states may be selected.

To facilitate use of the partition-set, the channels are sorted by the channel sorter 716. More particularly, the channel sorter 716 sorts the channels based on their $|h|^2$ value to produce a ranked list. The channel sorter 716 provides a ranked list of the resource elements to the CCP calculator 708 (step 804). Based on the partition-set configuration received in step 802 and the ranked list received in step 804, the CCP calculator 708 allocates (step 806) a search space size to each channel based on the corresponding elements of the partition set. The CCP calculator 708 then creates (step 808), for each resource element n, $RE_n$, a search space centered around $y_n'$ with the corresponding state defined in the partition set. Upon completion of the creation (step 808) of the N search spaces, the CCP calculator 708 may then transmit (step 810) the N search spaces to the tree structure 720. The CCP calculator 708 may also create (step 812) a tree structure, to be discussed in detail below. Upon completion of the creation (step 812) of the tree structure, the CCP calculator 708 may then decode (step 814) the received signal estimates $y_n'$.

As an example, it may be assumed that $|h_0'|^2 > |h_1'|^2 > |h_2'|^2 > |h_3'|^2$. Responsive to determining these channel estimates $h_n'$, the channel sorter 716 may sort the channels into a ranked list, [channel 0, channel 1, channel 2, channel 3]. It may also be assumed that the original signals s0, s1, s2, s3, s4 and s5 are transmitted with equal power. Also in this example, it may be assumed that the partition-set to be used is {16, 24, 32, 64}.

Reviewing FIG. 2, it may seen that the transmitted signal $x_0$ includes contributions from s1, s2 and s5. Accordingly, it may be considered that received signal $y_0$ also includes contributions from $s_1$, $s_2$ and $s_5$. Similarly, received signal $y_1$ includes contributions from $s_0$, $s_2$ and $s_4$, received signal $y_2$ includes contributions from $s_1$, $s_3$ and $s_5$, and received signal $y_3$ includes contributions from $s_0$, $s_3$ and $s_4$.

Figure 9:
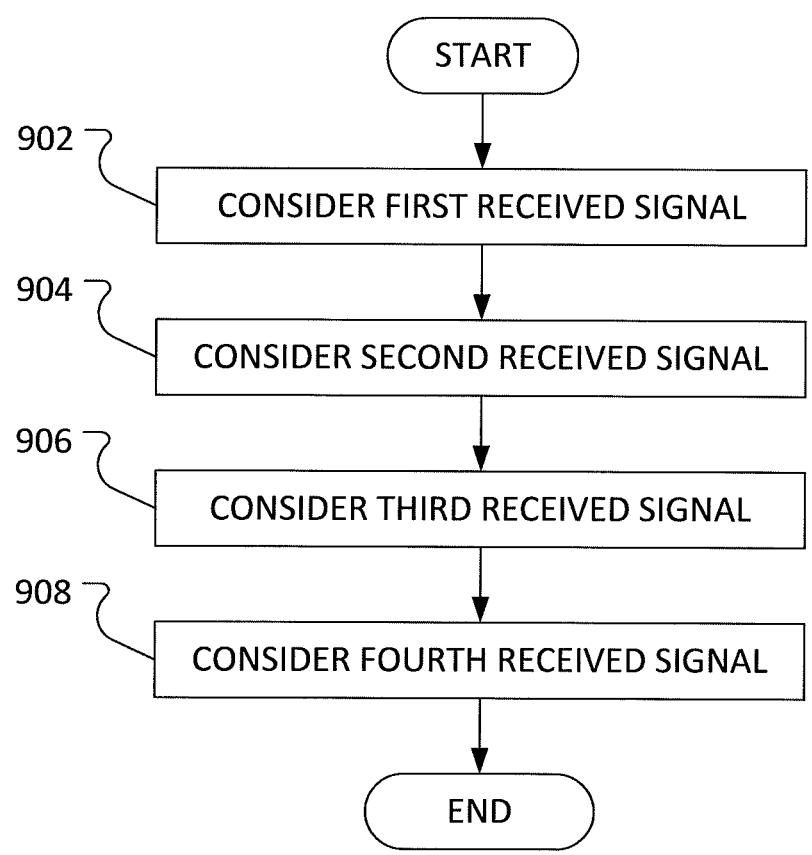
FIG. 9 is a block diagram illustrating example steps in a method of search space creation that also involves tree structure creation according to the present disclosure.

FIG. 9 illustrates example steps in a method of search space creation (step 808) that also involves tree structure creation (step 812) according to aspects of the present application. The method of FIG. 9 begins with the CCP calculator 708 considering (step 902) the first signal estimate, $y_0'$, that has been received over the channel that has the highest $|hn'|^2$ value. That is, the signal that has been received on the channel with the highest rank in the ranked list.

Because the received signal $y_0$ includes contributions from three original signals $s_1$, $s_2$ and $s_5$ and the codeword for these original signals was selected, by VN $202_1$, VN $202_2$ and VN $202_5$, respectively, from a codebook having M=16 codewords, it is possible that the received signal estimate $y_0'$ may have one of $16^3$=4096 states. Indeed, each of the received signal estimates $y_n'$ may have one of $16^3$=4096 states. That is, each of the received signal estimates $y_n'$ may be considered to have an initial search space with 4096 states.

Because the first element of the example partition-set is 16, the consideration (step 902) of the first signal estimate, $y_0'$, involves the CCP calculator 708 reducing the search space from 4096 states down to 16 states, as determined by the first element of the example partition-set. Accordingly, the consideration (step 902) of the first signal involves only 16 combinations of codewords for $s_1$, $s_2$ and $s_5$ in the search space centered around $y_0'$. These 16 combinations may be called "survivors." The 16 survivors are the combinations that have the closest Euclidean distance to $y_0'$.

When the CCP calculator 708 turns to creating (step 812) the tree structure, each survivor may be interpreted as one branch of a first level of the tree structure. In this case, the first level of the tree has 16 branches.

The method of FIG. 9 continues with consideration (step 904) of the second received signal estimate, $y_1'$, which has the second highest $|hn'|^2$ value and which has the second highest rank in the ranked list.

Because the second element of the example partition-set is 24, the consideration (step 904) of the second signal estimate, involves the CCP calculator 708 reducing the search space from 4096 states down to 24 states. Accordingly, after the consideration (step 904) of the second signal, only 24 combinations of codewords for $s_0$, $s_2$ and $s_4$ remain in the search space centered around $y_1'$. These 24 survivors are the combinations of $s_0$, $s_2$ and $s_4$ that have the 24 closest Euclidean distances to $y_1'$.

Similarly, when the CCP calculator 708 creates (step 812) the tree structure, each survivor may be interpreted as one branch of a second level of the tree structure. In this case, the second level of the tree has 24 branches.

The method of FIG. 9 continues with consideration (step 906) of the third signal estimate, $y_2'$, which has been received over the channel that has the third highest $|hn'|^2$ value. That is, the signal that has been received on the channel with the third highest rank in the ranked list.

Because the third element of the example partition-set is 32, the consideration (step 906) of the third signal estimate, $y_2'$, involves the CCP calculator 708 reducing the search space from 4096 states down to 32 states. Accordingly, after the consideration (step 906) of the third signal estimate, only 32 combinations of codewords for $s_1$, $s_3$ and $s_5$ remain in the search space centered around $y_2'$. These 32 survivors are the combinations of $s_1$, $s_3$ and $s_5$ that have the 32 closest Euclidean distances to $y_2'$.

When the CCP calculator 708 turns to creating (step 812) the tree structure, each survivor may be interpreted as one branch of a third level of the tree structure. In this case, the third level of the tree has 32 branches.

The method of FIG. 9 continues with consideration (step 908) of the fourth signal estimate, $y_3'$, which has been received over the channel that, as discussed hereinbefore for this example, has the fourth highest value. That is, the signal that has been received on the channel with the lowest rank in the ranked list.

The fourth element of the example partition-set is 64 and the consideration (step 908) of the fourth signal estimate, $y_3'$, involves the CCP calculator 708 reducing the search space from 4096 states down to 64 states. Accordingly, after the consideration (step 908) of the fourth signal estimate, only 64 combinations of codewords for $s_0$, $s_3$ and $s_4$ remain in the search space centered around $y_3'$. The 64 survivors are the combinations of $s_0$, $s_3$ and $s_4$ that have the 64 closest Euclidean distances to $y_3'$.

As will be more fully explained below, when the CCP calculator 308 turns to creating (step 812) the tree structure, no fourth level is added to the tree structure.

Figure 10:
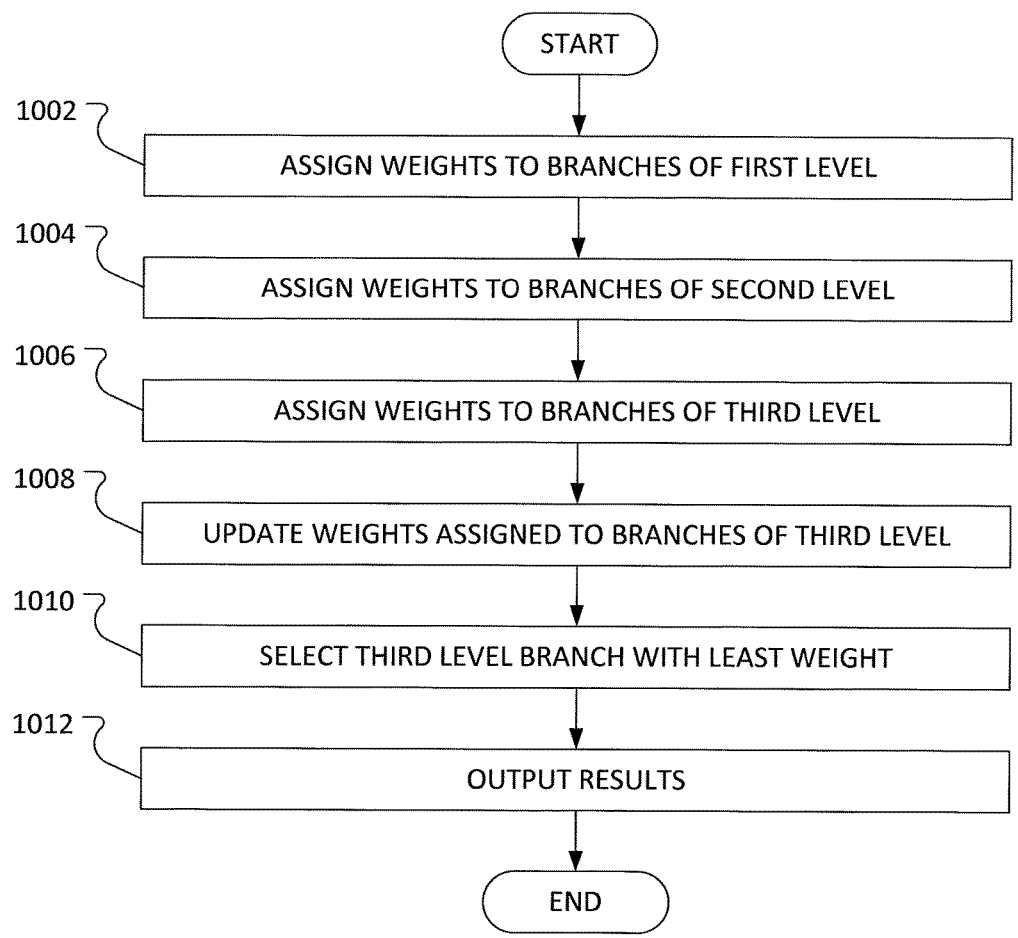
FIG. 10 is a block diagram illustrating example steps carried out by the tree structure generator in a method of weighting branches of the tree structure and determining an estimate of the original signals.

FIG. 10 illustrates example steps carried out by a method of weighting branches of the tree structure generator 720 and determining estimates of the original J signals.

As set out above, the first level of the tree structure has 16 branches. The tree structure generator 720 may assign (step 1002) a weight to each of the 16 branches. The weight of a given branch may be the Euclidean distance between the received signal estimate $y_0'$ and the combination of codewords for $s_1$, $s_2$ and $s_5$ associated with the given branch. A shorter Euclidean distance is associated with a lower weight.

The tree structure generator 720 then proceeds to assign (step 1004) a weight to each of the branches of the second level of the tree structure. Each of the branches of the second level of the tree structure may have a father branch in the first level of the tree structure. The weight of a given branch in the second level of the tree structure may be the combination of the weight of the father branch in the first level of the tree structure and the Euclidean distance between the received signal estimate $y_1'$ and the combination of $s_0$, $s_2$ and $s_4$ associated with the given branch. Notably, there may be, among the 24 survivors in the search space centered around $y_1'$ particular survivors that do not have a father branch. This is because $y_0'$ and $y_1'$ both include a contribution from $s_2$. If a given $s_2$ value does not exist in the search space centered around $y_0'$, the branches in the search space centered around $y_1'$ that are associated with the given $s_2$ value will not be considered to be part of the search space centered around $y_1'$. In such a case, the second level of the tree may have fewer than 24 branches.

The tree structure generator 720 then proceeds to assign (step 1006) a weight to each of the 32 branches of the third level of the tree structure. Each of the branches of the third level of the tree structure may have a father branch in the second level of the tree structure. The weight of a given branch in the third level of the tree structure may be the sum of the weight of the father branch in the second level of the tree structure and the Euclidean distance between the received signal estimate $y_2'$ and the combination of $s_1$, $s_3$ and $s_5$ associated with the given branch. Notably, there may be, among the 32 survivors in the search space centered around $y_2'$, particular survivors that do not have a father branch in the second level. In such a case, the third level of the tree structure may have fewer than 32 branches.

Because the received signal estimate $y_3'$ includes contributions from $s_0$, $s_3$ and $s_4$, it may be considered that no new items of the original sequence are introduced by consideration (step 908) of the received signal estimate $y_3'$. Accordingly, the tree structure received by the tree structure generator 720 from the CCP calculator 708 has no fourth level. As such, rather than assign weights to branches of a fourth level, the tree structure generator 720 updates (step 1008) the weights associated with the branches of the third level of the tree structure. The updated weight of a given branch in the third level of the tree structure may be the sum of the weight of the given branch, associated with the given branch in step 1006, and the Euclidean distance between the received signal estimate $y_3'$ and the combination of $s_0$, $s_3$ and $s_4$ associated with the given branch. Notably, there may be, among the 64 survivors in the search space centered around $y_3'$, particular survivors that do not correspond to a branch in the third level of the tree structure.

The tree structure generator 720 continues the method of FIG. 10 by selecting (step 1010) the third level branch with the lowest updated weight. The selected third level branch corresponds to a particular codeword for original item $s_3$. The selected third level branch also has a single second level father branch. The single second level branch corresponds to a particular codeword for original item $s_0$ and a particular codeword for original item $s_5$. The single second level branch also has a single first level father branch. The single first level father branch corresponds to a particular codeword for original item $s_1$, a particular codeword for original item $s_2$ and a particular codeword for original item $s_4$.

Accordingly, upon selecting (step 1010) the third level branch with the updated least weight, it may be considered that a candidate sequence of J signal estimates, $s'_0$, $s'_1$, $s'_2$, $s'_3$, $s'_4$ and $s'_5$, has been determined, where the candidate sequence is an estimate of the original J signals $s_0$, $s_1$, $s_2$, $s_3$, $s_4$ and $s_5$. The tree structure generator 720 proceeds to output (step 1012) the candidate sequence as output. Alternatively, the tree structure generator 720 may determine an LLR for each bit of the signals in the candidate sequence and then output (step 1012) the LLRs.

Figure 11A:
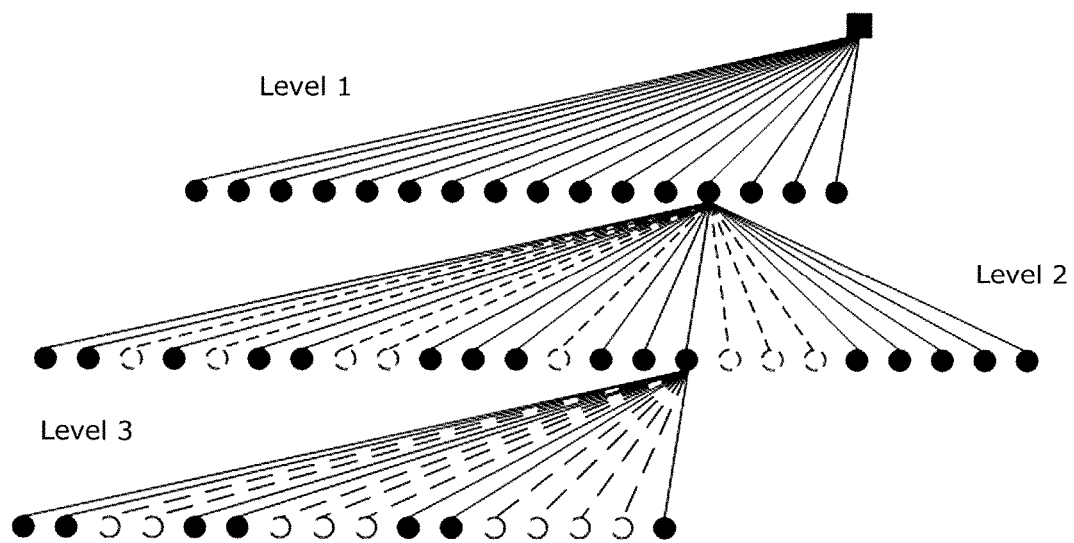
FIGS. 11(a) and 11(b) are block diagrams illustrating an example use of tree structure in decoding a SCMA coded signal.
Figure 11B:
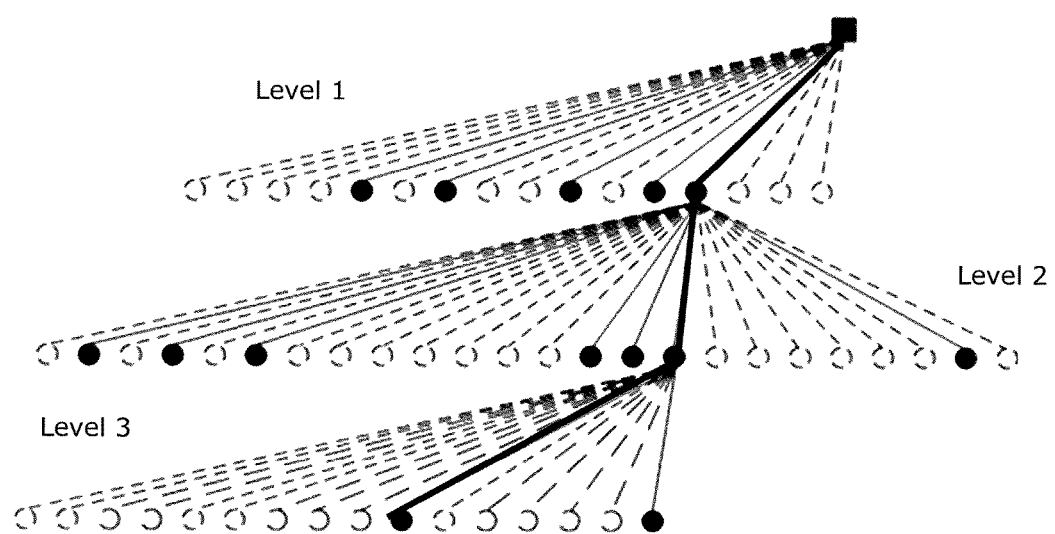

FIGS. 11A and 11B illustrate an example tree structure used for decoding a sparsely encoded signal based on the example steps set out in methods of FIGS. 9 and 10. The example of FIGS. 11A and 11B are based on the example of FIG. 2. In the tree structure of FIGS. 11A and 11B, the highest quality signal forms level 1 of the tree, the second-highest quality signal forms level 2 of the tree, and so forth.

However, the construction of a tree structure may lead to a further problem, in that the decision to dismiss a child branch is dependent on the corresponding father branch. If the father branch is reliable, this is not an issue. However, in practical implementation, the metric of the father branch may include error (e.g., due to channel noise and fading). If the father branch is unreliable, a child tree may be incorrectly dismissed. Once dismissed, there may not be any effective way to recover the dismissed child tree.

A possible technique to improve the reliability of the father branch may be the use of successive-interference-cancellation (SIC). SIC is a technique that has been used on the physical layer. Using SIC, a receiver may receive two or more signals that arrive simultaneously, meaning that the signals may interfere with each other. The principle of SIC is that the receiver may decode a higher quality signal and the decoded signal may subsequently be used to build the interference to help to decode a lower quality signal. In an example implementation of SIC, the receiver may first decode the highest quality signal from the combined received signal, then cancel the decoded signal from the combined signal to generate a residual signal. The highest quality signal from the residual signal is then decoded, and canceled from the residual signal to generate a further residual signal. This process continues iteratively for successive signals, in order from highest quality to lowest quality, until all signals are recovered.

In the context of RS-MLSE, a received signal $y_n$ with a better characteristic related to the received signal or related to the quality of the resource element over which the received signal is transmitted, such as a better signal to noise ratio (SNR), signal power level $s_n$, channel factor $h_n$, channel factor to noise ratio $$\frac{|h n'|^2}{|N_o|^2},$$

a high quality signal is more likely to be decoded. If a characteristic related to the received signal or related to the quality of the resource element the signal quality of $y_n$ is good enough ("higher quality signals"), for example, a SNR is above a predefined threshold, the $s_k$ contained in $y_n$ may be decoded without knowing other signals that SNRs are below a predefined threshold ("lower quality signals"). For example, just a single level tree that considers only $y_n'$ may be sufficient to decode for $y_n'$. Thus, the decoded $s_k$ contained in $y_n'$ may be used to inform decoding of other lower quality signals, in accordance with SIC. For example, the decoded results of the high quality signal $y_n$ may be decoded and checked (e.g., using forward error correction (FEC) and/or cyclic redundancy check (CRC)). The checked and verified bits may be encoded and modulated again, and fed back into the decoding process. The $s_k$ decoded from $y_n$ may thus be used to more surely dismiss or keep a child tree and reduce the search space. In some examples, two or more high quality signals may be decoded first without considering other signals, and the decoded and checked results from the two or more high quality signals may be used to decode lower quality signals.

Referring to FIG. 7, in applying SIC to the RS-MLSE decoder 700, the tree structure generator 720 may be generated only for signal(s) of interest, starting from the highest quality signal(s) of interest. At 722, the RS-MLSE algorithm may be applied only to the higher quality signal(s) of interest. The resulting decoded higher quality input signal(s) may then be verified using suitable error checking techniques at 724, for example forward error correction (FEC) and/or cyclic redundancy check (CRC). It should be noted that error checking may be performed on the decoded signal(s) after decoding, or it may be performed after a series of signals have been decoded. After verification, the higher quality input signal(s) among the signal(s) of interest are known. This knowledge may be used to discard branches on the MLSE tree structure with greater confidence, and may also be used to further reduce and regenerate the search subspace for other signal(s) of interest.

At 726, the verified decoded bits may then be encoded again. For example, encoding, modulation and channel coefficients may be applied to reconstruct the VN signal that has been decoded with greater confidence. The re-encoded high quality signal(s) may be fed back to build the tree structure and further reduce the search subspace for the remaining lower quality signal(s). For example, based on the verified decoded signal(s), it is known that certain father branches for the tree structure can be dismissed (e.g., those branches that contain $s_k$ values not found in the verified decoded signal(s)) with greater certainty. Because the higher quality signal has been decoded and verified, the higher level of the tree will have only one branch. This means that, in the example of FIG. 11A, not all level 1 branches may need to grow child branches, thus entire child trees may be dismissed with greater certainty. As well, the search subspace(s) for lower quality signal(s) may be further reduced. For example, it may be possible to reduce each search subspace by removing states with $s_k$ values that conflict with the verified decoded signal(s).

At 728, the RS-MLSE algorithm may be applied one or more remaining signals of interest. At 730, the decoded lower quality signal(s) may be checked for error, for example using FEC and/or CRC.

The combined result of the error checking at 724 and 730 may be outputted as the complete set of decoded input signals (e.g., $s_0$ to $s_5$, in the example of FIG. 2).

In one embodiment, decoding may be performed for all the transmitted signals, while in other examples only a subset of the transmitted signals may be of interest and only that subset may be decoded. Generally, decoding may begin using the highest quality signal among the signals of interest, which may be different from the highest quality signal among all the signals, and subsequently decoding the lower quality signal(s) of interest. In some examples, the outputted decoded signals may be a subset of all the decoded signals. For example, a high quality signal that is not of interest may nonetheless be decoded so that it may be used to assist in decoding of a signal of interest that is of lower quality. Subsequently, only the decoded signal of interest may be outputted.

Various examples described herein may enable better performance than a RS-MLSE SCMA decoder without SIC. For example, the use of SIC may provide more reliable decisions on keeping or dismissing branches and child trees in the tree structure.

Examples described herein may also enable easier practical implementation, compared to RS-MLSE without SIC. For example, there may be a lower demand on memory, because instead of having to allocate memory for all searching spaces and multiple-level tree structure at the same time, only one searching space and one level of the tree structure (i.e., corresponding to the highest quality received signal) need to be handled at a time. Complexity may be also reduced. For example, if the receiver is interested in only a part of the input signal, rather than the full set of input signals, SIC-RS-MLSE may better manage complexity and resource allocation, for example by enabling the SCMA receiver to decode only the signal(s) of interest among the total received signals.

Thus, various examples described herein may enable implementation of a relatively low complexity and relatively fast decoder for SCMA decoders.

In an alternative embodiment, rather than transmitting the original signals $s_0$, $s_1$, $s_2$, $s_3$, $s_4$ and $s_5$ with equal power, the power used to transmit selected ones of the original signals may be boosted relative to the power level used to transmit the remaining original signals.

The selected original signals that are given the power boost may be known to the RS-MLSE decoder 700 of FIG. 7. Indeed, the creating (step 808, FIG. 8) the search spaces may be enhanced through access to information on which of the original signals given the power boost. As discussed previously, the search space of a received signal given the power boost may be further reduced, for example, with a smaller search threshold. Such dynamic configuration of the partition-set may be also be consider by the partition-set selector 718 of FIG. 7 when it determines a particular partition-set to be used by the decoder 700. For example, a smaller states may be selected for the original signals received the power boost.

Alternatively, the ranking carried out by the channel sorter 716 may be influenced by the information regarding which of the original signals has been given the power boost. Accordingly, the ranking of the channels may take into account more than just the value of $|h|^2$.

Notably, the complexity of implementing a brute-force MLSE decoding algorithm may be shown to have an order $O(M^{df+N})$, where N is the number of the FNs. It may be shown that, when the partition-set configuration is $\{S_0, S_1, S_2, S_3\}$ the complexity of implementing the RS-MLSE decoding algorithm may be considered to have an order $O(S_0 * S_1 * \ldots * S_{K-1})$. It may be shown that $O(S_0 * S_1 * \ldots * S_{K-1}) < O(M^{df+N})$.

In one embodiment, a non-transitory computer readable medium comprises instructions encoded thereon, the instructions, when executed by a processor of a decoder, causing the decoder to:

receive one or more sparsely encoded data sequences in a plurality of received signals over a corresponding plurality of subcarriers, wherein each received signal is associated with a plurality of possible states based on a plurality of predefined sparsely encoded data sequences associated with the each received signal;

generate an estimate for each received signal;

determine a reduced search space for the estimate, the reduced search space comprising a number of states within a search threshold from the estimate, the search threshold being based on a characteristic related to received signal and/or to a quality of a resource element over which the received signal is transmitted; and decode the estimate within the reduced search space to recover the one or more sparsely encoded data sequences.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of decoding a plurality of signals, comprising, at a receiving device:
   receiving a plurality of received signals over a corresponding plurality of resource elements, wherein each received signal is associated with a plurality of possible states and represents sparsely encoded data combined from a plurality of input signals that have been sparsely encoded using respective codewords;
   generating a received signal estimate for each of the plurality of signals;
   determining, for each of the plurality of received signals:
      a search threshold based on at least one of: (i) a characteristic of the received signal and (ii) a quality of the corresponding resource element over which the received signal was received, wherein the characteristic of the received signal comprises at least one of signal to noise ratio (SNR) and signal power level, and the quality of the corresponding resource element for determining the search threshold comprises at least one of a channel factor estimate and a channel factor estimate to channel noise ratio; and
      a respective reduced search space comprising a number of states within the search threshold from the received signal estimate for the received signal; and
   decoding each of the plurality of the received signal estimates within the respective reduced search spaces to recover the input signals.

2. The method according to claim 1 wherein the number of possible states associated with each received signal is at least greater than the number of states of the reduced search space.

3. The method according to claim 1, wherein decoding each of the signal estimates within the respective reduced search spaces comprises decoding the plurality of signal estimates using a message passing algorithm (MPA).

4. The method according to claim 3, comprising, for each of the respective reduced search spaces, determining conditional channel probabilities (CCPs) for the states based on an estimated channel, and a signal estimate, and decoding each of the signal estimates using the MPA is based on the CCPs.

5. The method according to claim 1, wherein determining the search threshold for each of the plurality of received signals comprises one or more of:
   determining a search threshold that results in a respective reduced search space including a fewer number of states for a received signal that has a higher signal to noise ratio than for a received signal that has a relatively lower signal to noise ratio;
   determining a search threshold that results in a respective reduced search space that includes a fewer number of states for a received signal that has a higher signal power level than for a received signal that has a relatively lower signal power level;
   determining a search threshold that results in a respective reduced search space that includes a fewer number of states for a received signal received over a resource element that has a higher channel factor estimate or higher channel factor estimate to channel noise ratio than for a received signal received over a resource element having a relatively lower channel factor estimate or lower channel factor estimate to channel noise ratio, respectively.

6. The method according to claim 1 wherein determining the search thresholds for the plurality of received signals comprises:
   determining channel estimate factors for each of the plurality of resource elements;
   ranking the plurality of resource elements based, at least in part, upon the channel estimate factors, thereby producing a ranked list of resource elements; and
   determining the respective reduced search spaces for the plurality of received signals comprises:
   allocating predefined reduced search spaces among the received signals based on the ranking of the resource elements in the ranked list.

7. The method according to claim 1, wherein at least one of the received signals was transmitted with a known power-boost, and wherein the respective search space for the at least one received signal is determined based at least partly on the known power-boost.

8. The method according to claim 1 wherein the respective codewords used to sparsely encode the input signals are sparse code multiple access (SCMA) codewords from respective SCMA codebooks or SCMA codebook layers, and each received signal is formed codeword elements from a plurality of the SCMA codewords.

9. The method of claim 1 wherein each resource element comprises a subcarrier of a multicarrier signal.

10. A system for decoding a plurality of signals, comprising a non-transitory memory configured to store instructions and a processor configured to receive instructions from the non-transitory memory to cause the system to:
   receive, at a signal interface, a plurality of received signals over a corresponding plurality of resource elements, wherein each received signal is associated with a plurality of possible states and represents sparsely encoded data combined from a plurality of input signals that have each been sparsely encoded using respective codewords;
   generate, at a pre-processing module, a received signal estimate for each of the plurality of received signals;
   determine, at a Conditional Channel Probability(CCC) Calculator, a respective reduced search space for each of the plurality of received signal estimates, the reduced search space for each received signal estimate comprising a number of states within a search threshold from the received signal estimate, the search threshold for each received signal estimate being based on at least one of: (i) a characteristic related to the received signal that the received signal estimate was generated for and (ii) a quality of the resource element corresponding to the received signal that the received signal estimate was generated for, wherein the characteristic related of the received signal comprises at least one of signal to noise ratio (SNR) and signal power level, and the quality of the corresponding resource element for determining the search threshold comprises at least one of a channel factor estimate and a channel factor estimate to channel noise ratio; and decode each of the received signal estimates within the respective reduced search spaces to recover the input signals.

11. The system according to claim 10 wherein the system is a base station.

12. The system according to claim 10 wherein the system is a user equipment (UE).

13. The system according to claim 10, wherein the system is a wireless transceiver unit.

* * * * *